United States Patent [19]
Lin et al.

[11] Patent Number: 6,134,144
[45] Date of Patent: Oct. 17, 2000

[54] FLASH MEMORY ARRAY

[75] Inventors: Tien L. Lin, Saratoga; Ben Yau Sheen, Milpitas, both of Calif.

[73] Assignee: Integrated Memory Technologies, Inc., Santa Clara, Calif.

[21] Appl. No.: 09/153,843

[22] Filed: Sep. 15, 1998

Related U.S. Application Data

[60] Provisional application No. 60/059,349, Sep. 19, 1997, provisional application No. 60/059,683, Sep. 19, 1997, and provisional application No. 60/059,797, Sep. 23, 1997.

[51] Int. Cl.$^7$ .................................................. G11C 16/04
[52] U.S. Cl. .............................. 365/185.14; 365/185.11; 365/185.12
[58] Field of Search .......................... 365/185.14, 185.11, 365/185.12, 185.23, 185.33

[56] References Cited

U.S. PATENT DOCUMENTS

| | | |
|---|---|---|
| 4,673,829 | 6/1987 | Gupta . |
| 5,282,170 | 1/1994 | Buskirk et al. . |
| 5,406,517 | 4/1995 | Chang et al. . |
| 5,493,534 | 2/1996 | Mok . |
| 5,621,689 | 4/1997 | Sakakibara et al. . |
| 5,627,838 | 5/1997 | Lin et al. . |
| 5,737,258 | 4/1998 | Choi et al. . |
| 5,740,109 | 4/1998 | Morton et al. ................. 365/185.33 X |
| 5,844,839 | 12/1998 | Smayling et al. . |

*Primary Examiner*—Huan Hoang
*Attorney, Agent, or Firm*—Ronald L. Yin; Limbach & Limbach LLP

[57] ABSTRACT

A novel flash memory array has an array of memory cells with each memory cell being of a floating gate memory transistor with a plurality of terminals. The memory cells are arranged in a plurality of rows and a plurality of columns, with a word line connecting the memory cells in the same row. A row decoder is positioned adjacent one side of the memory array and is connected to the plurality of word lines for receiving an address signal and for supplying a low voltage signal. A plurality of programming lines are connected to the plurality of rows of memory cells of the array with a programming line connected to the memory cells in the same row. The plurality of programming lines are collinear with but spaced apart from the plurality of word lines and extending only to the row decoder. A high voltage generating circuit is positioned adjacent the other side of the array, opposite the one side, and connected to the plurality of programming lines for receiving the address signal and for supplying a high voltage signal to the plurality of programming lines in response thereto.

10 Claims, 22 Drawing Sheets

Memory Cell Operation (a) Program –PGM (Memory Cell [A] Selected)

| CELL | Drain (BL) | Source (A V$_{SS}$) | Word-Line (WL) | Control-Gate (CONG) |
|---|---|---|---|---|
| Cell (A) | 3.5v/0v | 6v | 1.5v | 10v |
| Cell (B) | 3.5v/0v | 6v | 0v | 10v |
| Cell (C) | 3.5v | 6v | 1.5v | 10v |
| Cell (E) | 3.5v/0v | 0v | 0v | 0v |
| Cell (G) | 3.5v | 0v | 0v | 0v |

(c) Page Erase –PER (Page 0 Selected)

| CELL | Drain (BL) | Source (A V$_{SS}$) | Word-Line (WL) | Control-Gate (CONG) |
|---|---|---|---|---|
| Page 0 | 3.5v | 6v | 0v | -10v |
| Page 1 | 3.5v | 0v | 0v | -1.5v |

(e) Read (Memory Cell [A] Selected)

| CELL | Drain (BL) | Source (A V$_{SS}$) | Word-Line (WL) | Control-Gate (CONG) |
|---|---|---|---|---|
| Cell (A) | 1.5v | 0v | 5v | 1.5v |
| Cell (B) | 1.5v | 0v | 0v | 1.5v |
| Cell (C) | floating /0v | 0v | 5v | 1.5v |
| Cell (E) | 1.5v | 0v | 0v | 1.5v |
| Cell (G) | floating /0v | 0v | 0v | 1.5v |

*FIG. 17*

FLASH MEMORY ARRAY

This application claims the benefit of U.S. Provision Application No. 60/059,349 filed Sep. 19, 1997, entitled Flash Memory Array, and of U.S. Provision Application No. 60/059,683 filed Sep. 19, 1997, entitled Negative Voltage Pump Circuit, and of U.S. Provision Application No. 60/059,797 filed Sep. 23, 1997, entitled Programming and Testing of Flash Memory Array.

TECHNICAL FIELD

The present invention relates to a non-volatile memory array architecture for programming and testing of the non-volatile memory cells. The present invention also relates to a circuit for a negative pump for use in a non-volatile memory array.

BACKGROUND OF THE INVENTION

Flash memory cells are well known in the art. Typically they are arranged in an array comprising a plurality of columns and rows. Examples of a flash memory cell are disclosed in a pending U.S. patent application Ser. No. 09/110,096, filed on Jul. 2, 1998, whose disclosure is incorporated by reference. Memory cells are typically arranged in an array. One example of an array is disclosed in U.S. Pat. No. 5,493,534. Negative charge pumps for use in a non-volatile memory array are also well known in the art. See, for example, U.S. Pat. Nos. 4,673,829; 5,406,517; and 5,282,170.

SUMMARY OF THE INVENTION

Various aspects of a novel flash memory array are disclosed. One aspect of the novel array is that the each memory cell comprises a floating gate memory transistor having a plurality of terminals, with the memory cells arranged in a plurality of rows and a plurality of columns. A plurality of word lines are connected to the plurality of rows of the memory cells with a word line connected to the memory cells in the same row. A row decoder is positioned adjacent one side of the memory array and is connected to the plurality of word lines for receiving an address signal and for supplying a low voltage signal to the plurality of word lines in response thereto. A plurality of programming lines are connected to the plurality of rows of memory cells of said array. The plurality of programming lines are collinear with but spaced apart from the plurality of word lines and extending only to the row decoder. A high voltage generating circuit is positioned adjacent the other side of the array, opposite the one side, and connected to the plurality of programming lines for receiving the address signal and for supplying a high voltage signal to the plurality of programming lines in response thereto.

Other aspects of the invention, include the strapping of various word or row lines to metal lines to provide better conductivity; providing a test pattern on the non-volatile memory cells; providing a stress test on the non-volatile memory cells; sharing a decoding circuit for all of the rows in the same page or sector for erase and programming; providing a compact decoding circuit to supply a non-programming voltage to all non-selected cells; and providing a negative voltage pump.

BRIEF DESCRIPTION OF THE DRAWINGS

FIG. 17 is a chart summarizing the voltages supplied to select and non-selected cells in a program/erase/read operation.

DETAILED DESCRIPTION OF THE DRAWINGS

In the present invention, a flash memory array is disclosed. It can be used with any type of flash memory cell.

However, it is particularly suitable for use with the following flash memory cell.

Flash Memory Cell

Figure 1A:
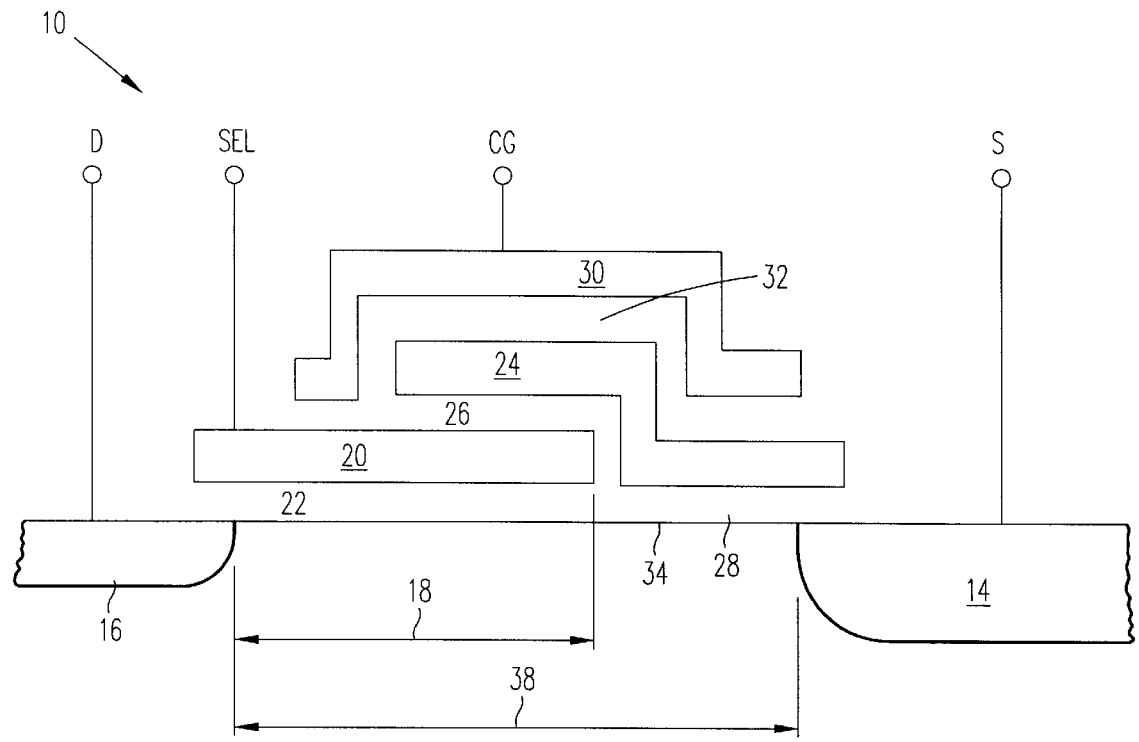
FIG. 1(a) is a schematic cross sectional view of a first embodiment of a memory cell used in the present invention.

One embodiment of a memory cell 10 is shown in FIG. 1(a). The memory cell 10 comprises a semiconductor substrate 12, with a source 14, a drain 16, and a channel 18 separating therebetween. A select gate 20, is positioned over a first portion 38 of the channel 18, separated therefrom by a first insulating layer 22. Although the select gate 20 is shown as overlapping a portion of the drain 16 in FIG. 1(a), it is not essential that the select gate 20 overlap the drain 16. The select gate 20 is the first polycrystalline silicon layer to be deposited over the substrate 12. Unlike the addressing gate shown and described in U.S. Pat. No. 4,462,090, the select gate 20, used in the memory cell 10 is planar and hence is not subject to misalignment. The first insulating layer 22 can be of conventional insulating material, such as silicon oxide.

A floating gate 24, which is made from the second polycrystalline silicon layer, has two portions: a first portion, which is over the select gate 20, and is separated therefrom by a second insulating layer 26, and a second portion, which is over the substrate 12, and is separated therefrom by a third insulating layer 28. The second portion of the floating gate 24 extends over a portion of the channel 18, between the select gate 20 and the source 14. In addition, the second portion of the floating gate 24 extends over the source 14.

A control gate 30 is over the select gate 20, and the floating gate 24, and separated therefrom by a fourth insulating layer 32. The memory cell 10 is controlled by voltages supplied to the four terminals: source 14, drain 16, select gate 20, and control gate 24.

Figure 1B:
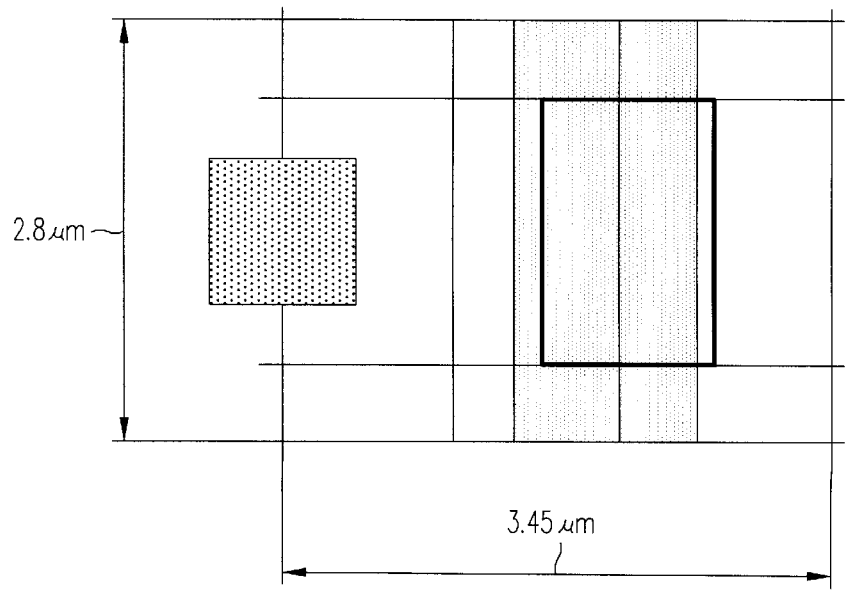
FIG. 1(b) is a top layout view of the first embodiment of the cell shown in FIG. 1(a), using a 1 μm CMOS design rule.

A layout drawing of the memory cell 10 is shown in FIG. 1(b), which is drawn based on the design rules of a 1 $\mu$m CMOS technology. Because of the scalability of the cell which will be discussed later, the cell dimension can be reduced in near direct proportion to the line width of a scaled technology. Using a 1 $\mu$m CMOS technology for example, the n+ drain region 16 can be 0.3 $\mu$m in depth; the n+ source region 14 can be 0.5~0.6 $\mu$m in depth; the first insulation film region 22 can be a 180 Å thermally grown $SiO_2$ film; the third insulation film region 28 can be a 100 Å thermally grown $SiO_2$ film; the second insulation film region 26 can be an ONO film with an equivalent thickness of 250 Å of $SiO_2$; the fourth insulation film 32 can be another ONO film with an equivalent thickness of 250 Å of $SiO_2$. The length of the select gate 20 can be 1 $\mu$m; the total floating gate 24 length can be 1.1 $\mu$m, with 0.5 $\mu$m overlapping on the select gate and 0.6 $\mu$m directly on the substrate; the length of the control gate 30 can be 1.1 $\mu$m, with 0.25 $\mu$m overlapping the select gate 20 and 0.85 $\mu$m overlapping the floating gate 24.

The memory cell 10 can be manufactured generally in accordance with the following steps:

a) forming an isolated active device region, on a semiconductor substrate 12 of a first conduction type;

b) forming a first insulation film 22 on the active device region of the semiconductor substrate 12;

c) forming a select gate 20, through the first insulation film 22, on the active device region of the substrate which defines the first channel region;

d) forming a third insulation film 28 on the active device region which is not covered by the select gate 20, and a second insulation film 26 on the select gate 20;

e) forming a floating gate 24, through the third insulation film 28, on the semiconductor substrate 12 which defines the second channel region, and, through the second insulation film 26, on the select gate 20;

f) forming the fourth insulation film 32 on the select gate 20 and floating gate 24;

g) forming the control gate 30, through the fourth insulation film 32, on the select gate 20 and floating gate 24;

h) forming the source region 14 and drain region 16 by doping the source and drain regions, 14 and 16 respectively, by ion implantation of a second conductor type, such as arsenic. Typically, spacers are placed adjacent to the floating gate 24 and the select gate 20. The arsenic is implanted at a concentration of approximately $1 \times 10^{15}$ to $1 \times 10^{16}$ ions/cm$^2$, and an implant voltage of 30 kev to 80 kev. Because of the presence of the spacers, which is required to form the LDD junction of the periphery transistors for reducing hot electron effects of short channel transistors, the implanted arsenic will have little or no overlap with the floating gate 24. Thereafter, lateral diffusion of the arsenic implant will bring the arsenic dopant to a region substantially near the side wall of the floating gate 24 and select gate 20. However, the overlap between the floating gate 24 and the source region 14 is not sufficient to permit Fowler-Nordheim tunnelling of a magnitude required for the operation of the cell. Thus, a second implant is required to form a deeper source region 14 which overlaps to a greater degree with the floating gate 24;

i) forming the source region 14 which is overlapped by a portion of the floating gate 24, by implanting ions of a second conductivity type, such as phosphorus, with or without the presence of the spacer adjacent to the side wall of the floating gate 24 and then causing lateral diffusion of the ion implantation in the source region 14, through thermal diffusion. The phosphorus is implanted at a concentration of approximately $1 \times 10^{14}$ to $1 \times 10^{16}$ ions/cm$^2$, at a voltage of approximately 30 to 80 kev. The implanted phosphorous forms a deeper source region 14 than the drain region 16, because phosphorous has a 1.5 to 2 times deeper implant range and 2 to 3 times higher diffusion constant than that of arsenic. The deeper source junction causes greater overlap with the floating gate 24, which provides the tunneling area for erase operation. The higher concentration of source region with phosphorous implant also minimizes the voltage drop between the source node and the source-to-tunnel oxide interface region, so that higher tunneling current can be induced. Another reason to have a deeper source junction is that it will have a higher grounded gate or negative gate assisted junction breakdown voltage, and more importantly it will have a lower band-to-band tunneling current which causes leakage from source junction to the substrate. The band-to-band tunneling current will present an excessive load to the on-chip voltage multiplier causing difficulty for low $V_{cc}$ operation.

Erase or Write "1"

To write a "1" or to erase a memory cell 10, which causes the memory cell 10 to be in a conductive state, a high voltage of, for example, 12 V is applied to the source S 14. The drain D 16, select gate SEL 20 and control gate CG 30 are all at ground potential. Because of the high capacitive couplings between the floating gate 24 and the select gate 20, and between the floating gate 24 and the control gate 30, and because of a fairly small capacitive coupling between the source region 14 and the floating gate 24, and because of the overlap between the source region 16 and the floating gate 24, a large percentage of the applied voltage appears across the source 14 and floating gate 24. This causes the electrons to tunnel from the floating gate 24 to the source 14, but not to the substrate, through the Fowler-Nordheim tunneling mechanism.

Figure 2:
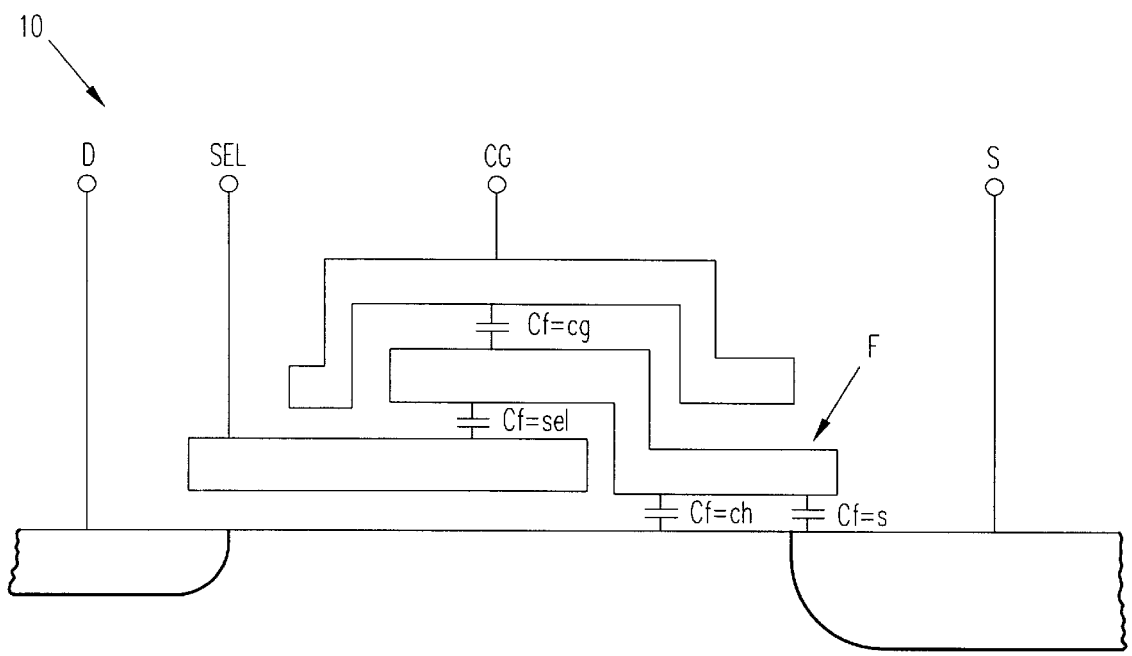
FIG. 2 is a schematic cross sectional view of the first embodiment of the memory cell shown in FIG. 1(a), showing the principle coupling capacitors.

The capacitive coupling elements are shown in FIG. 2. The voltage differential between the floating gate and source, $\Delta V_{f\text{-}s}$, can be expressed as:

$$\Delta V_{f\text{-}s} = V_s(C(f\text{-}cg) + C(f\text{-}sel))/(C(f\text{-}cg) + C(f\text{-}sel) + C(f\text{-}s)) = V_s Re$$

Where

Re is the coupling ratio during erase operation, and $Re = (C(f\text{-}cg) + C(f\text{-}sel))/(C(f\text{-}cg) + C(f\text{-}sel) + C(f\text{-}s))$ Vs is the source voltage;

C(f-cg) is the total coupling capacitance between the floating and control gate;

C(f-sel) is the total coupling capacitance between the floating and select gate;

C(f-s) is the total coupling capacitance between the floating gate and source.

With the dimensions given above, the erase coupling ratio, Re, is 89%;. Since Vs is 12V, a total of 10.68 V appears across the 100 Å tunneling oxide (i.e. third insulating film 28) which is sufficient to induce a significant tunneling current from the source 14 to the floating gate 28 and cause the floating gate 28 to be positively charged.

With source voltage at 12V, a band-to-band tunneling mechanism may occur at the source junction which will increase the magnitude of the source current. Since an on-chip voltage multiplier is usually used for supplying the high voltage, the band-to-band tunneling current will require a more robust voltage multiplier design.

An alternative way to erase the cell 10 is to apply a negative bias (~–8 to –10 V) to the control gate 30, while holding the select gate 20 at ground potential or the same negative gate bias as the control gate 30 and raise the voltage at the source 14 only to 5 V or close to Vcc, such as 6–7 V. The advantage of this approach is that the source voltage is now at a lower potential. By reducing the source voltage, it allows one to supply the source voltage either directly from the Vcc power supply or from a voltage multiplier with fewer pumping stages for higher current supply capability.

Program or Write "0"

To write a "0" to a memory cell 10, which causes the memory cell 10 to be in a non-conductive state, a high voltage of, for example, 5 to 8 V is applied to the source S 14. A second high voltage of 10 to 12 V is applied to the control gate 30. The drain voltage is kept at 0 V or a small bias voltage on the order of 0.3 to 1.0 volts. A small voltage which is just above the threshold voltage Vt of the transistor under the select gate 20, e.g. Vt+$\Delta$V where $\Delta$V~0.1V to 0.5V, is applied to the select gate 20. The voltage at the select gate 20 causes the transistor to conduct a small current, on the order of micro amperes, from drain 16 to source 14. Because of the high voltages which are applied the control gate 30 and source region 14, the potential at the floating gate 24 is coupled high. The floating gate voltage, Vf can be obtained by the following equation:

$$Vf = (Vcg*C(f\text{-}cg) + Vsel*C(f\text{-}sel) + Vs*C(f\text{-}s))/(C)(f\text{-}cg) + C(f\text{-}sel) + C(f\text{-}s))$$

Where,

Vcg is the voltage applied to the control gate 30;

Vsel is the voltage applied to the select gate 20;

Vs is the voltage applied to the source 14;

C(f-cg), C(f-sel) and C(f-s) are the same as those defined previously.

By applying Vcg=12 V, Vs=8 V and Vsel=1V, then Vf=9.1 V. This potential will cause the channel near region 34 to be pulled high. The surface potential of the substrate 12 immediately below the left edge of the portion of the floating gate 24 over the channel 18, is estimated to be about one volt below the floating gate voltage or 8 V. Due to the fact that the select transistor is biased to just above the threshold voltage, the channel potential below the select gate 20 is close to that of the drain voltage, which is 0 V or a small bias voltage, as discussed previously. Hence a voltage differential of approximately 8 V is developed across the region in the channel 18 immediately below the select gate 20 and the region in the channel 18 immediately below the floating gate 24. The width of the gap between the region of the channel immediately below the select gate 20 and the region of the channel immediately below the floating gate 24 is approximately 200 to 400 Å. An electric field of 2 to 4 MV/cm is thus developed, which is high enough to cause hot electron injection from the channel 18 to the floating gate 24 and to charge the floating gate 24 to a non-conductive state.

The capacitive coupling elements of the memory cell 10 are formed by the overlapping areas between the select gate 20 and the floating gate 24, between the floating gate 24 and the control gate 30, and between the source region 14 and the floating gate 24. These areas are either vertically stacked or formed along the side walls. The coupling ratios of the memory cell 10 will not degrade as that of the conventional cell due to scaling because the ratio of the vertically stacked components are independent of scaling and the capacitance of the side wall components only depend on the thickness of the polysilicon gates, not the scaling dimension.

Because of the high coupling ratio provided by both the select gate 20 and control gate 30 to the floating gate 24, the width of the floating gate 24 does not have to be wider than that of the active diffusion region as shown in FIG. 1(b). For this reason, the size of the memory cell 10 can be comparable to or less than the size of a conventional stack-gate type flash cell, which requires certain overlap between the floating gate and the field oxide area to increase the coupling ratio.

Further, due to the split-gate structure, the memory cell 10 does not have the over-erase problem of the stack-gate cells. In addition, a unique feature of the memory cell 10 is that the select gate 20 length can be defined to be the minimum line width. Unlike the conventional split gate construction, the memory cell 10 is completely insensitive to alignment variations. This eliminates the punch-through and leakage problems which are commonly seen in the conventional split-gate type flash memory cells, exemplified by that shown in U.S. Pat. No. 5,029,130. Therefore, the memory cell 10 is superior to both the conventional stack and split gate cells.

Due to the nature of low programming and erase currents, the high voltages required for both the programming and erase operations can be supplied by an on-chip voltage multiplier. The voltage multiplier can be operated from a single 5V, 3.3V or lower power source. Hence this cell allows the memory array to be operated from a single power source of 5, 3.3 or lower voltage.

Figure 3:
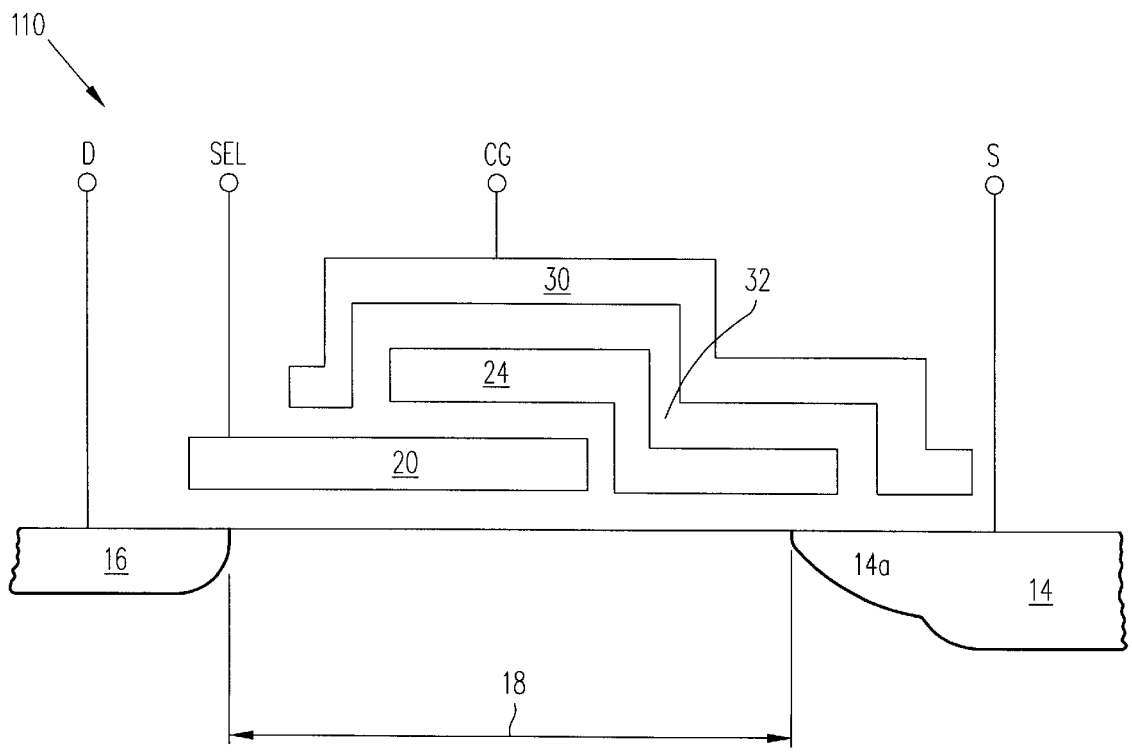
FIG. 3 is a schematic cross sectional view of a second embodiment of a memory cell used in the present invention.

A second embodiment of a memory cell 110 is shown in schematic cross sectional view in FIG. 3. The memory cell 110 has the same components as that of the embodiment shown in FIG. 1(a). Therefore, the same number will be used to designate like parts. The only difference between the second embodiment shown in FIG. 3 and the first embodiment shown in FIG. 1(a) is that the control gate 30 wraps around the floating gate 24, and extends over the source region 14, but is insulated therefrom. The advantages of the memory cell 110 are two folds: (1) the control gate 30 wraps around the floating gate 24 completely so that mis-alignment between the control gate 30 and the floating gate 24 will not affect the coupling ratio of the cell 110. (2) The tunnel oxide region, i.e. the portion of the third insulating layer 28 located near the edge of the floating gate 24, over the source region 14 is usually very vulnerable to damages induced by the source region ion implantation process. With the control gate 30 wrapped completely around the floating gate 24 including the corner, it serves to protect the integrity of the tunnel oxide. However, in order for the source junction to reach a level below the tunnel oxide region, a n region 14a is formed prior to the deposition of the control gate 30. The formation of the n region 14a is done by direct ion implantation after the floating gate 24 is formed and before or after the fourth insulating layer 32 is formed. The implanted species can be AS or P⁺. Thermal drives are followed to cause the implant species to diffuse to a region under the floating gate.

Figure 4:
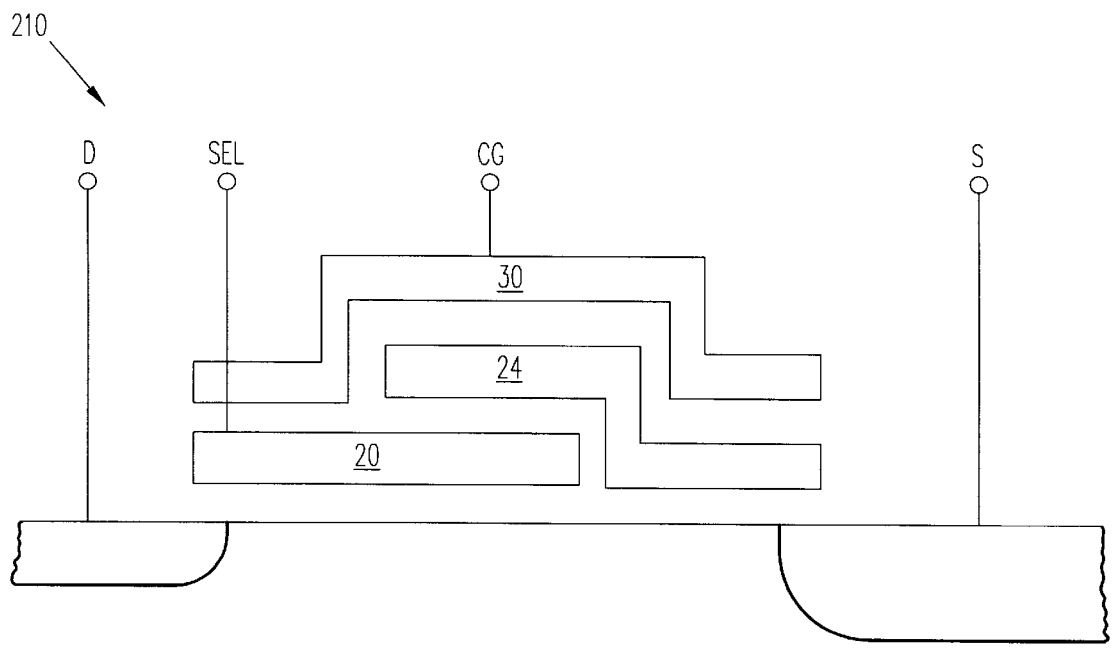
FIG. 4 is a schematic cross sectional view of a third embodiment of a memory cell used in the present invention.

A third embodiment of a memory cell 210 is shown in schematic cross sectional view in FIG. 4. Again, since the memory cell 210 is similar to the memory cell 110 and memory cell 10, like parts will be designated with like numerals. The only differences between the memory cell 210 from the memory cell 110 and the memory cell 10 are: 1) the control gate 30 of the memory cell 210 has one edge aligned with an edge of the select gate 20 over the drain region 16; and 2) the control gate 30 of the memory cell 210 has another edge aligned with an edge of the floating gate 24, over the source region 14.

Prior to the formation of the control gate 30, the select gate 20 and the floating gate 24 are defined so that the left edge of the select gate 20 and the right edge of the floating gate 24 extend beyond the final dimension of the control gate 30. After the control gate 30 is defined, the control gate 30 is used as the etching mask to etch the left edge of the select gate 20 and the right edge of the floating gate 24. The main advantage of the memory cell 210 is that the cell size is smaller than the memory cells 110 and 10. The draw back is that the length of the select gate 20 is a function of the mis-alignment between the control gate 30 and the select gate 20, and the length of the floating gate 24 is a function of the mis-alignment between the control gate 30 and the floating gate 24.

Figure 5A:
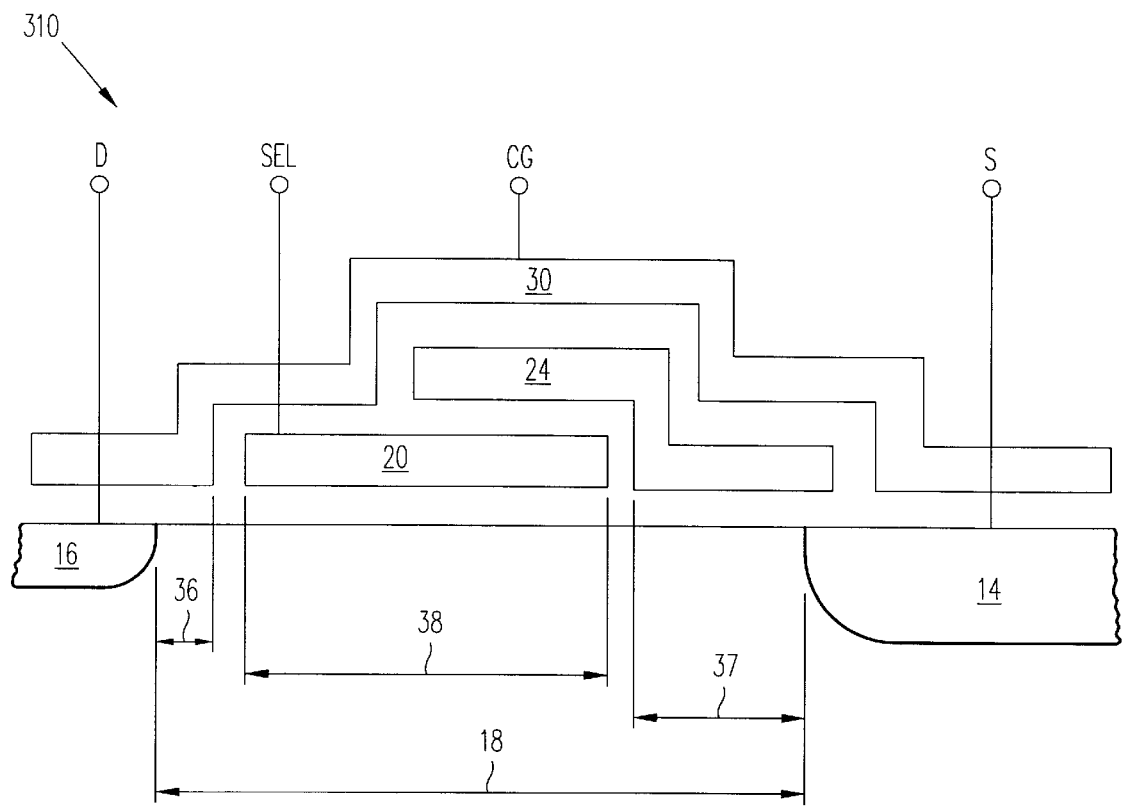
FIG. 5(a) is a schematic cross sectional view of a fourth embodiment of a memory cell used in the present invention.
Figure 5B:
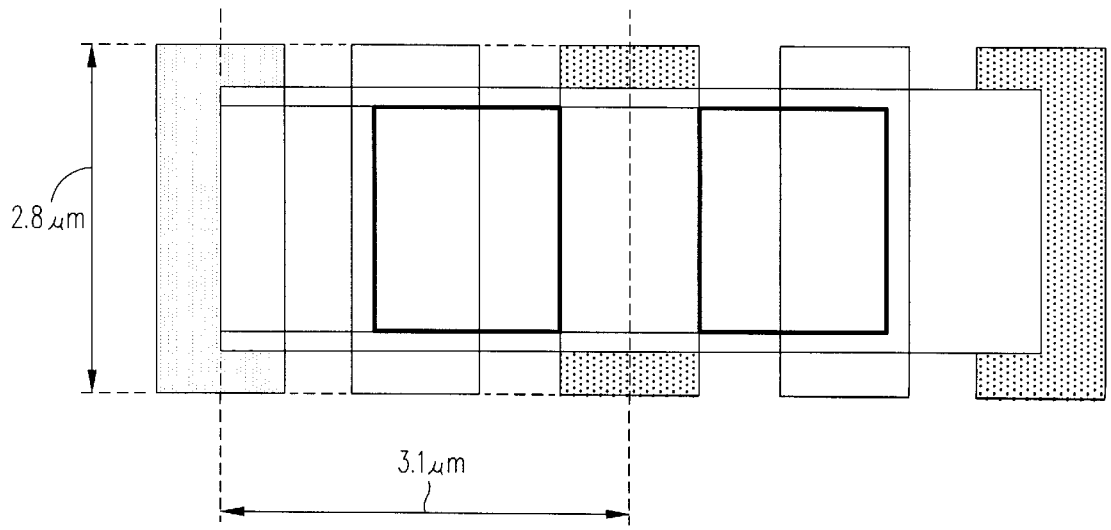
FIG. 5(b) is a top layout view of the fourth embodiment of the cell used in the present invention shown in FIG. 5(a), using a 1 μm CMOS design rule.

A fourth embodiment of a memory cell 310 is shown in schematic cross sectional view in FIG. 5(a). Again, since the memory cell 310 is similar to the memory cells 210, 110 and 10, like parts will be designated with like numerals. The difference is that the channel 18 is divided into three regions. As before, a select gate 20, is positioned over a first portion 38 of the channel 18, separated therefrom by a first insulating layer 22. A floating gate 24 has a first portion over the select gate 20 and is insulated therefrom, and has a second portion over the substrate 12 and is insulated therefrom and extends over a second portion 37 of the channel 18, between the select gate 20 and the source 14. A control gate 30 has a portion over the floating gate 24 and is insulated therefrom, a portion over the select gate 20 and is insulated therefrom, and is over a third portion 36 of the channel 18, and is insulated therefrom. In addition, the control gate 30 extends over the drain region 16, with the contact to the drain region 16 eliminated. Access to the drain region 16 is accomplished by a drain line in the substrate 12. The layout drawing of the fourth embodiment is shown in FIG. 5(b). With the memory cell 310, the control gate 30 serves also as the word line of the memory array. The memory cell 310 is selected when the control gate 30 is biased to a high voltage, or Vcc, which turns on the portion 36 of the channel 18, directly beneath the control gate 30. The select gate 20 will be biased so that the portion 38 of the channel 18 is always on during read. The memory cell 310 is programmed and erased in the same mechanism as described for the memory cells 210, 110, and 10.

Figure 6:
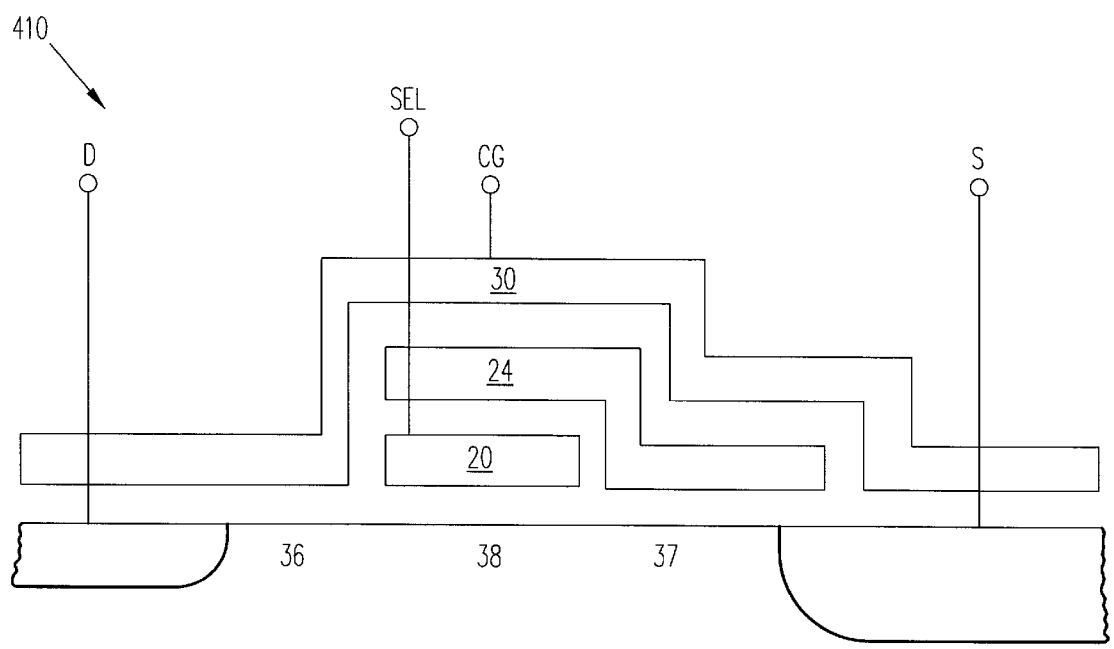
FIG. 6 is a schematic cross sectional view of a fifth embodiment of a memory cell used in the present invention.

A fifth embodiment of a memory cell 410 is shown in schematic cross sectional view in FIG. 6. The memory cell 410 is similar to the memory cell 310. The only difference between the memory cell 410 and the memory cell 310 is that the select gate 20 has an edge which is aligned with an edge of the floating gate 24, using a similar self-aligned technique described for the memory cell 210. Thus, the control gate 30 is directly over the floating gate 24 and the channel 18, but not directly over the select gate 20. Similar to the embodiment of the memory cell 310, the memory cell 410 has a channel with three portions 36, 37, and 38, with the select gate 20, floating gate 24, and control gate 30 over the three portions 38, 37, and 36, respectively. The operation principle of the memory cell 410 is the same as that of the memory cell 310.

Figure 7A:
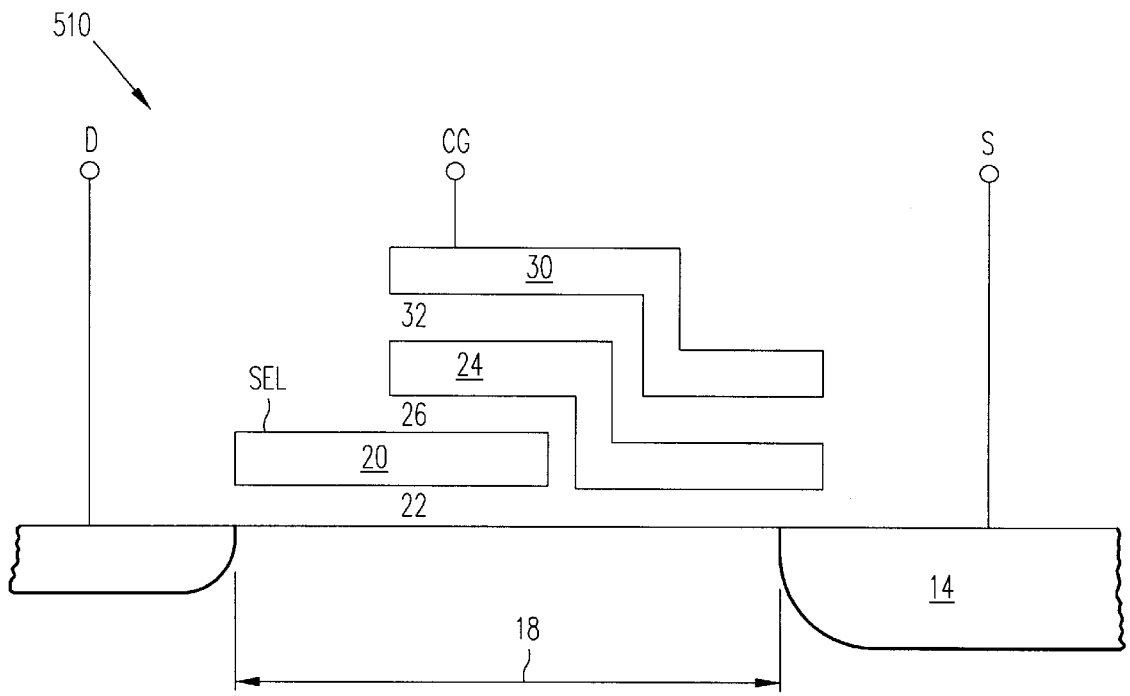
FIGS. 7(a) and 7(b) are schematic cross-sectional views of a sixth embodiment of a memory cell used in the present invention.

Referring to FIG. 7a there is shown a sixth embodiment of a memory cell 510. The memory cell 510 is similar to the memory cell 210. The only difference between the memory cell 510 and the memory cell 210 is that the control gate 30 has a first edge and a second edge which is aligned with a first edge and a second edge of the floating gate 24, using a self-aligned technique similar to that described for the memory cell 210. Thus, the control gate 30 is directly over the floating gate 24 and the channel 18 but not directly over the select gate 20. In addition, because the control gate has two edges which are aligned with the two edges of the floating gate 24, the structure is self-aligned. The operation principle of the memory cell 510 is the same as that of the memory cell 210. In addition, the memory cell 510 has the source region 14 and the drain region 16 formed by the method described previously for the memory cell 10.

Figure 7B:
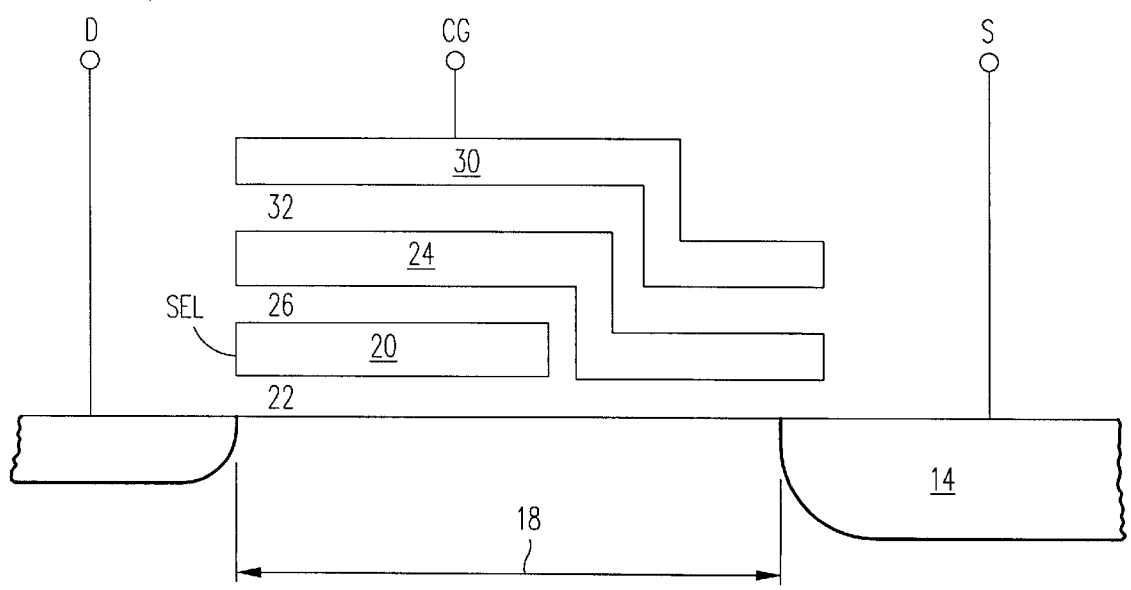

Referring to FIG. 7b there is shown yet another variation of a sixth embodiment of a memory cell 610. The memory cell 610 is similar to the memory cell 510. The only difference between the memory cell 610 and the memory cell 510 is that the select gate 20 also has an edge which is aligned with an edge of the floating gate 24 and also with an edge of the control gate 30. Thus, the control gate 30 has the first edge aligned with a first edge of the floating gate 24 and with one edge of the select gate 20. The control gate 30 has a second edge aligned with a second edge of the floating gate 24. The memory cell 610 also has its source region 14 and drain region 16 formed by the method described previously for the memory cell 10. The operation principle of the memory cell 610 is the same as that of the memory cell 510.

The advantage of the memory cell 510 and 610 is that with the control gate 30 having a first edge and a second edge aligned with a first edge and a second edge of a floating gate 24, the sensitivity due to the mis-alignment between the control gate 30 and the floating gate 24 can be eliminated. When the control gate 30 is anisotropically etched, the etching process can proceed through the polysilicon layer which becomes the control gate 30, through the insulating layer 32 between the control gate 30 and the floating gate 24, until the floating gate 24 is completely etched as defined by the two edges. Then, when the etch proceeds to the insulating region 26 between the floating gate 24 and the select gate 20, the etching can be stopped since the insulating layer 26 (typically silicon dioxide) can be used as an etch stop. When etching proceeds to the silicon dioxide 26, the etching slows down thereby indicating the end of the etching process. With the memory cell 610, the oxide layer 22 between the select gate 20 and the substrate channel 18 can be used as an etch stop in a self-aligned etching process. However, in order to etch through the select gate 20, a masking step is required to protect the rest of the memory cell, the memory array of which the cell is a part thereof, and the peripheral area, which are not covered by the select gate 20.

Finally, one other advantage of the memory cell 510 is that there can be a gradual step height transition. In the memory cell 510, there is a gradual change in height from the select gate 20 to the floating gate 24 and control gate 30. Since there is a gradual change in height, there is no abrupt step, minimizing a potential step coverage problem. On the other hand, the memory cell 610 will have a worse step coverage problem and the length of the select gate 20 will be affected by the alignment between the control gate 30 and the select gate 20. However, the memory cell 610 can be smaller in area than the memory cell 510.

The memory cell 10, 110, 210, 310, 410, 510 or 610 can be used in the arrays disclosed in U.S. patent application Ser. No. 08/619,258 filed on Mar. 18, 1996, whose disclosure is incorporated by reference herein. Alternatively, the memory cell 10, 110, 210, 310, 410, 510 or 610 can be used in the array shown in FIG. 8. The memory cells are arranged in a right and a left array 40a and 40b, respectively.

In the preferred embodiment the memory cells are arranged with 512 cells in a row in each of the arrays 40a and 40b. A group of eight rows of flash cells constitute one page. There are 256 pages of cells in each of the arrays 40a and 40b, or 2048 (8×256) rows. Therefore, each of the arrays 40a and 40b contains a total of approximately 1 Meg (8×256×512) cells with the two arrays 40a and 40b combined having 2 Meg cells. A word line decoder 42 is interposed between the right memory array 40a and the left memory array 40b, and separates them. The word line decoder 42 activates only one of the memory arrays 40a or 40b at a time. The word line decoder 42 decodes the address signal 44 and selects one of 256 page lines, and selects one word line within the eight word lines of a selected page. Thus, each page line activates eight rows of cells or (8×512) or 4096 cells. The selected page line is further decoded to eight word lines, with each word line connected to the select gate 20 of each of the cells in that row.

Figure 9:
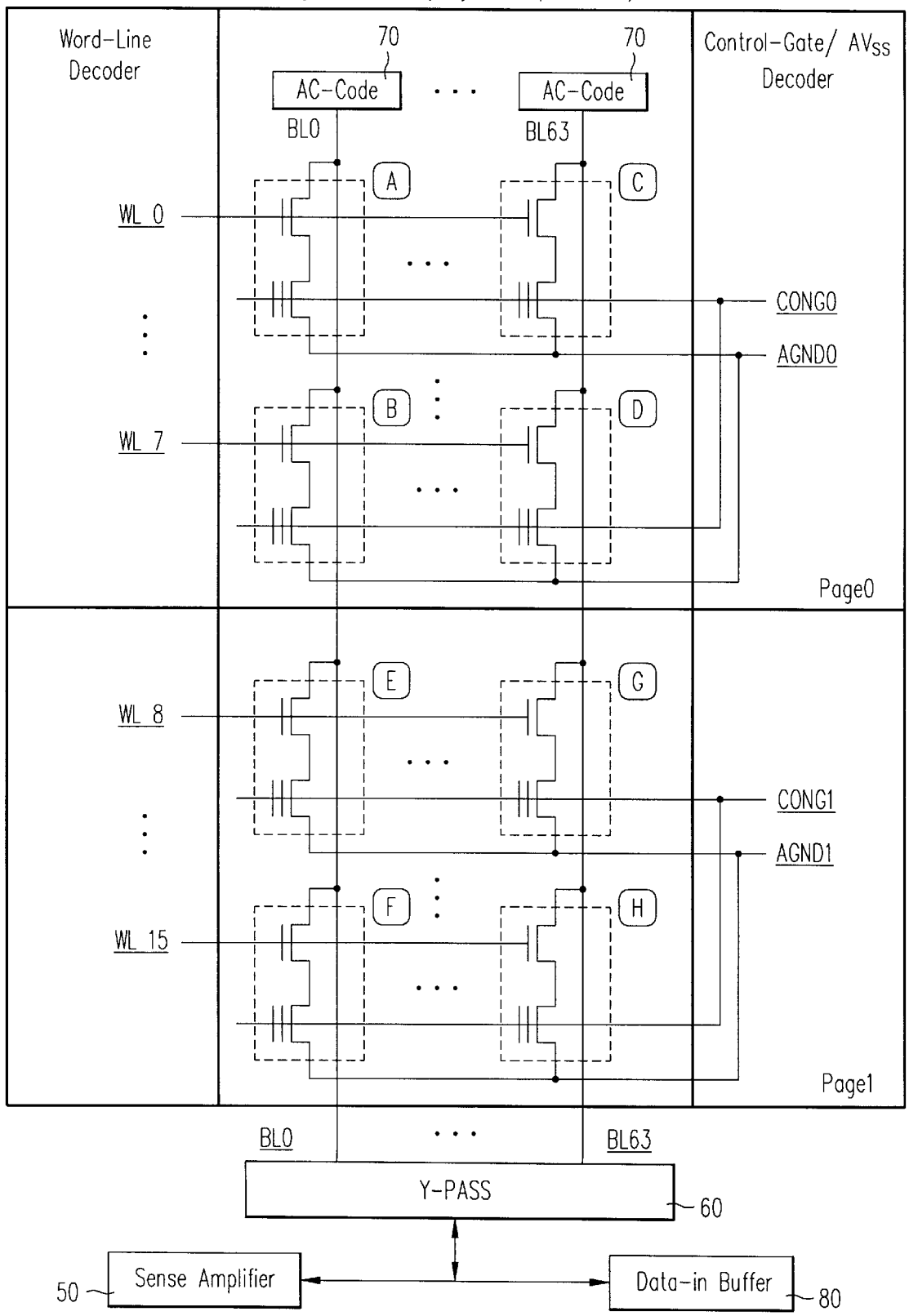
FIG. 9 is a detailed schematic circuit view of a portion of the array shown in FIG. 8.

Similarly, adjacent to the right memory array 40a or adjacent to the left memory array 40b is a control gate and AVSS driver 46a and 46b, respectively. Each of the control gate and AVSS drivers 46a and 46b generates a control gate signal congx and a ground signal agndx (where x is from 0 to 255), in response to the address signal 44, which is supplied to one of the pages of one of the memory arrays 40a or 40b. Thus, the control gate and AVSS driver 46a generates 256 cong signals and 256 agnd signals, with each cong signal supplied to the control gate 30 of the cells of one page of the right memory array 40a and with each agnd signal supplied to the source 14 of the cells of one page of the right memory array 40a. The control gate and AVSS driver 46b also generates 256 cong and agnd signals, with each cong and agnd signals supplied to one page of the left memory array 40b. This is shown in FIG. 9. Although FIG. 9 shows each memory cell as having two transistors, it should be noted that this is for illustration purpose only, and that the memory cell is as described heretofore.

Figure 8:
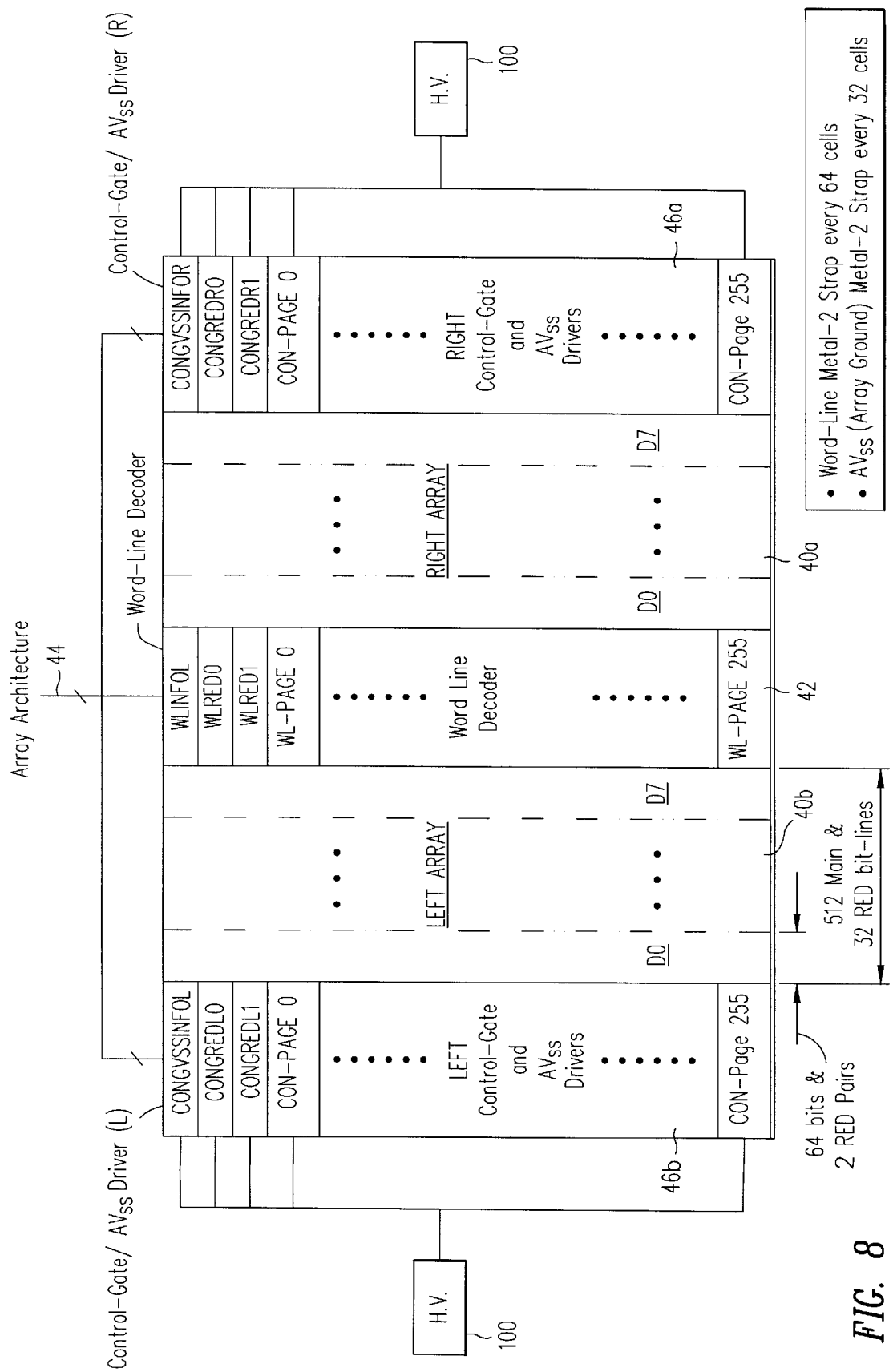
FIG. 8 is a plan view of one embodiment of a memory array architecture using the memory cells shown in FIGS. 1–7.
Figure 15:
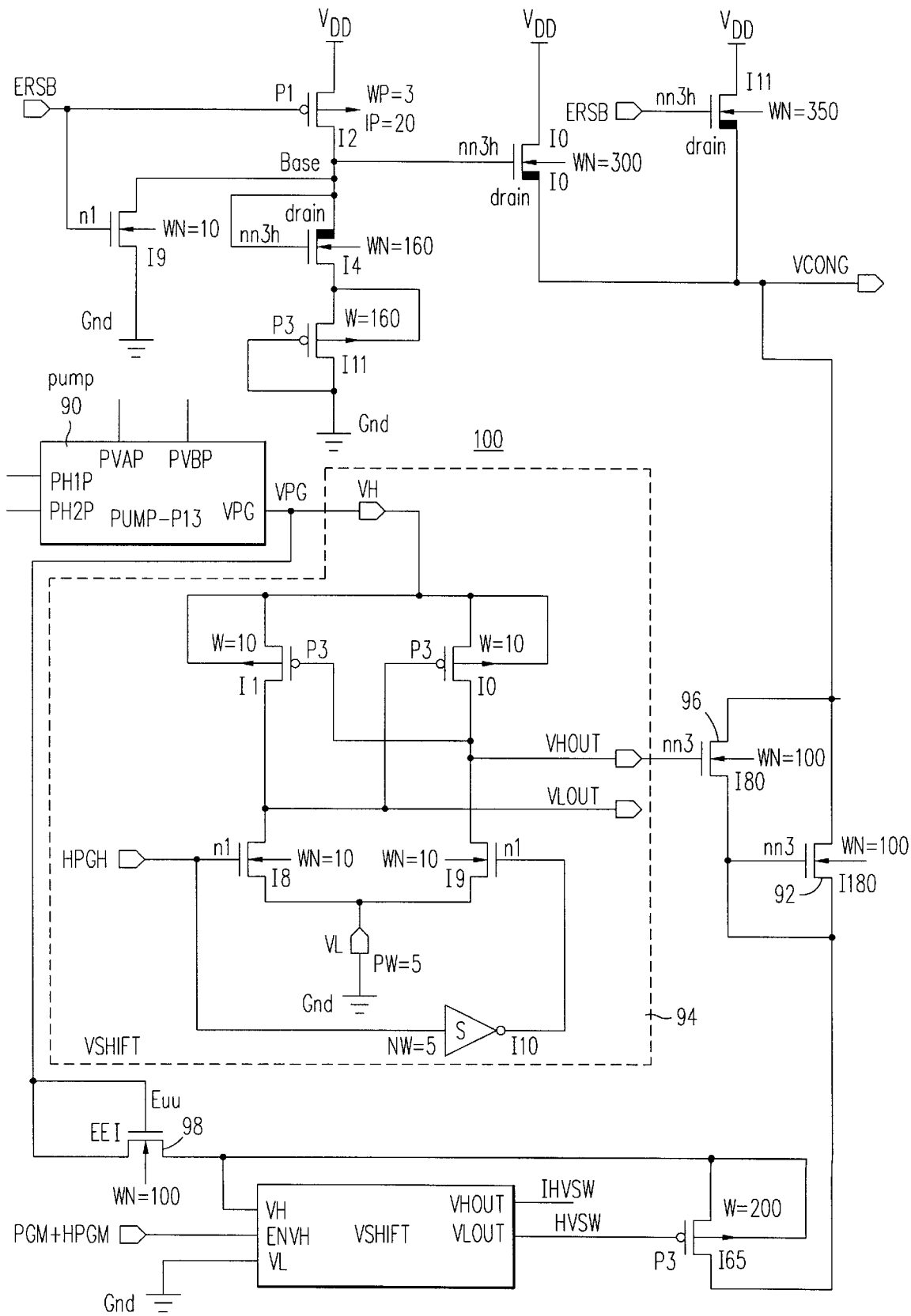
FIG. 15 is a circuit diagram of a voltage generator for providing high voltage to the control gate used in the memory array.

The cong signal is supplied with a high voltage signal by a charge pump 100, shown in FIG. 15. Although the memory array shown in FIG. 8 shows two charge pumps 100, with one for each control gate driver 46a and 46b, it is readily apparent that one single charge pump 100 can supply the high voltage signals to both control gate drivers 46a and 46b.

Figure 16:
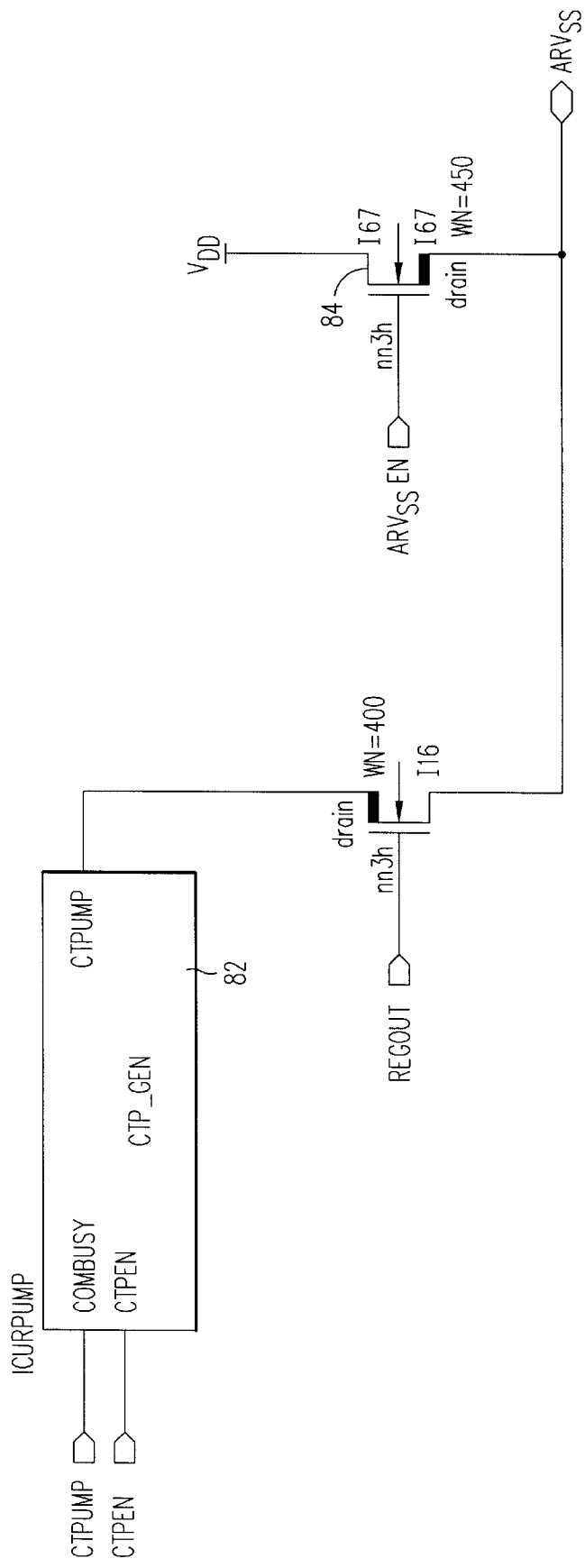
FIG. 16 is a diagram of a circuit which generates the voltages supplied to ARVSS, which is supplied to the source of the memory cells in the memory array.

The ARVSS signal is supplied by a source 82, shown in FIG. 16. Similar to the charge pump 100, the memory array shown in FIG. 8 can be supplied with one source 82 for each control gate driver and AVSS driver 46a and 46b, or a single source 82 can supply the voltage signals to both control gate driver and AVSS driver 46a and 46b. The source 82 supplies 6–8 volts which is provided to ARVSS during erase and program. During read, the voltage of 3.5 volts is supplied from VDD and is supplied through transistor 84.

Within each page of cells, there are eight congx lines, each supplied to one row of memory cells. However, within each page of cells, there are only four agndx lines, with each supplied to two rows of memory cells. The memory cells are arranged with adjacent rows of cells having the sources 14 connected to one another. Thus, only four agndx lines need to be supplied to the eight rows of cells in each page.

There are eight (8) sense amplifiers 50 for each memory array 40a and 40b. Thus, each sense amplifier 50 serves one I/O block of columns of memory cells, consisting of 64 bit lines of memory array 40a or 40b. Since as previously indicated, each of the memory subarrays 40a and 40b comprises 512 columns of memory cells, there are 8 I/O blocks in each of the memory arrays 40a or 40b. A first sense amp $50a_1$ would service memory I/O block 1, comprising memory cells connected to bit lines 0–63. A second sense amp $50a_2$ would service memory I/O block 2 comprising memory cells connected to bit lines 64–127, and so on. The selection of the particular one of the sixty-four (64) bit lines in each of the I/O blocks during read or programming is accomplished by address lines $A_0 \ldots A_5$. Alternatively, sense amplifiers 50a and 5b can be combined with only eight (8) sense amplifiers for both memory arrays 40a and 40b, with address line $A_{17}$ selecting memory array 40a or memory array 40b.

During read operation, the Y pass circuit 60 connects the selected bit line to the appropriate sense amplifier. The A/C code circuit 70 is inactive during read. During byte programming, the Y pass circuit 60 connects the selected bit line to the appropriate data buffer 80, while the A/C code decoding circuit 70 connects the non-selected bit lines in each of the memory I/O blocks to a source of voltage $V_{cc}$ (See FIGS. 11 & 12(a & b)) to prevent current flow in the non-selected cells.

Although the A/C code circuit 70 is shown in FIG. 9 as being located near the "top" of the memory array 40a or 40b, i.e. on a side opposite the side where the Y pass circuit 60 and sense amplifier 50 and data buffer 80 are located, this is for schematic illustration purpose only. In reality, the A/C Code circuit 70 is laid out in the memory subarrays 40a and 40b, as shown in FIGS. 10 and 12(a & b).

Figure 10:
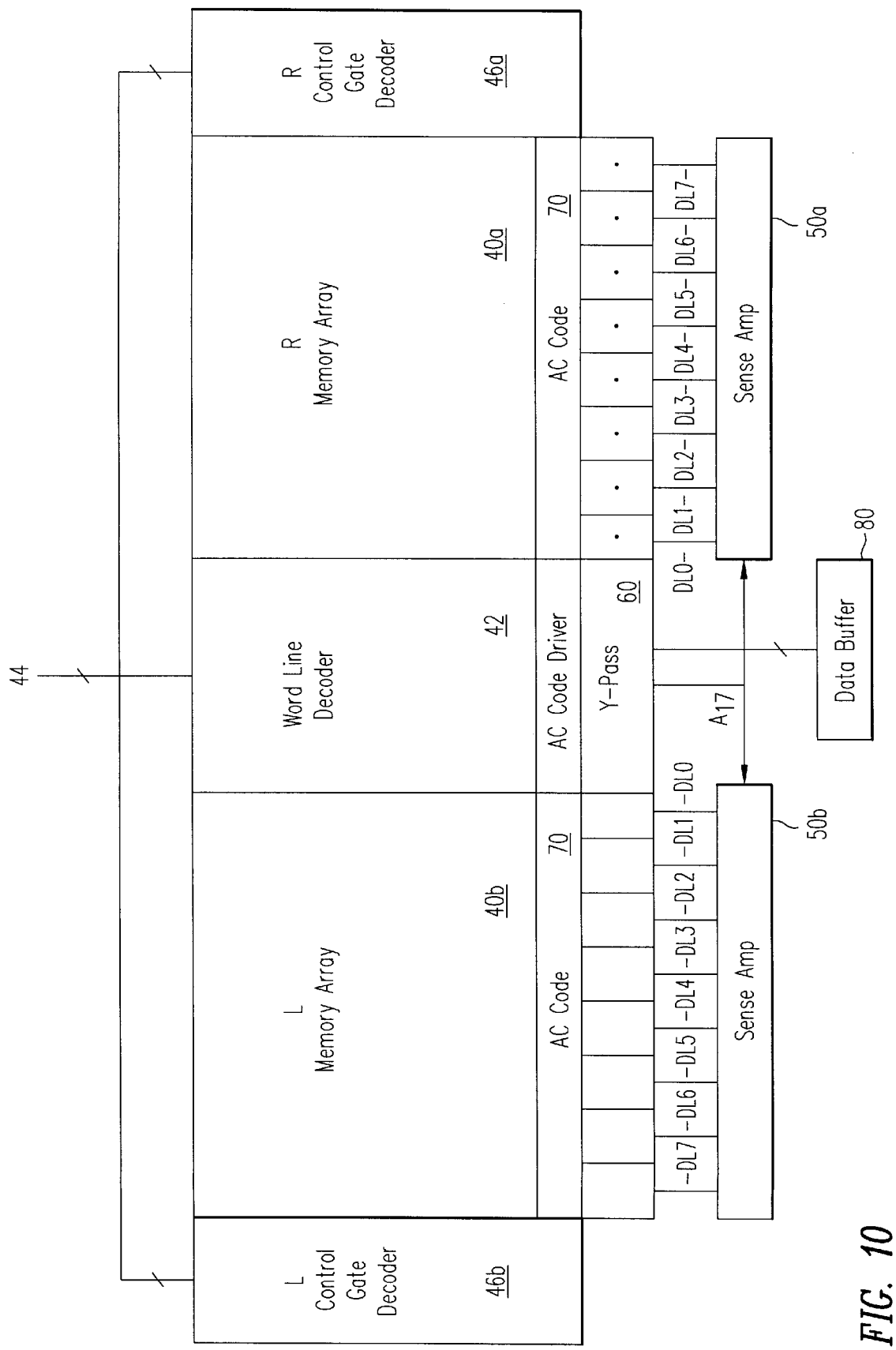
FIG. 10 is a detailed plan view of the memory array architecture shown in FIG. 8.

As shown in FIG. 10, each of the 64 bit lines in an I/O block is also supplied to a Y Pass circuit 60, which is a pass transistor. Each of the Y Pass transistors 60 receives a column select signal Yx (x=0–63). The column select signal Yx is a signal decoded from the address signals $A_0 \ldots A_5$, and $A_{17}$ selecting left or right memory arrays 50a and 50b. Each of the Y Pass transistors 60 connects each bit line of the I/O block to the sense amplifier 50, associated with that I/O block. The selection of the left sense amplifiers 50b or the right sense amplifiers 50a is accomplished by the address line $A_{17}$.

When a unique combination of address signals $A_0 \ldots A_5$ selects a particular bit line in an I/O block, the corresponding bit lines in each of the other seven I/O blocks are also selected. For example, if the address signals on the address lines $A_0 \ldots A_5$ causes the bit line 10 from the I/O block 1 (0–63 bit lines) to be selected, then bit line 74 from I/O block 2 (64–127 bit lines) and bit line 138 from I/O block 3 (128–193 bit lines), etc. are also selected. In short, when a programming or read operation from a memory subarray occurs activating the Y pass circuit, 8 data signals can be programmed or read simultaneously.

Figure 11:
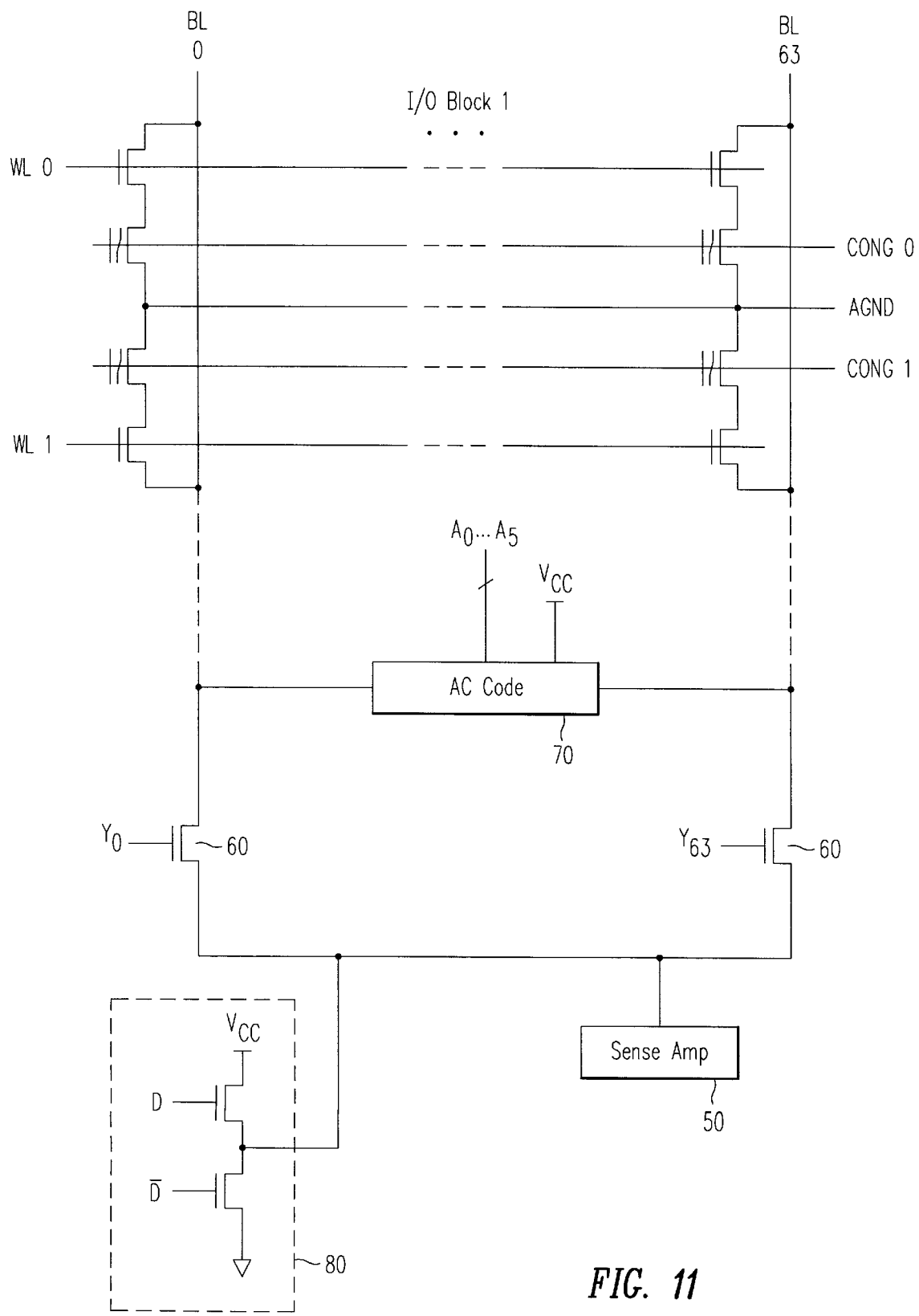
FIG. 11 is a detailed schematic circuit view of a portion of the array shown in FIG. 10.

Referring to FIG. 11 there is shown a schematic diagram of the A/C code decoding circuit 70, Y Pass transistors 60, sense amplifier 50 and data buffer 80 associated with the 64 bit lines (0–63) of the I/O block 1.

Referring to FIG. 12, there is shown in greater detail an example of the A/C Code decoding circuit 70, shown in FIG. 11. The A/C Code decoding circuit 70 receives the address lines $A_0 \ldots A_5$ as well as the complement signal lines $\overline{A_0} \ldots \overline{A_5}$. Thus, 12 address lines are supplied to each of the A/C Code decoding circuit 70. Depending upon whether each of the address signals is supplied to the gate of a pass transistor, the associated bit line would or would not be connected to the voltage source $V_{cc}$. For example, to connect bit line 0 to $V_{cc}$, one of the address signals $\overline{A_0}, \overline{A_1}, \overline{A_2}, \overline{A_3}, \overline{A_4}$ and $\overline{A_5}$ would have to be high. For bit line 1, one of the address signals $A_0, \overline{A_1}, \overline{A_2}, \overline{A_3}, \overline{A_4}$ and $\overline{A_5}$ would have to be high. As previously discussed, the AC code circuit 70 connects the non-selected bit line to $V_{cc}$ during byte programming. Therefore, during byte programming, $A_{17}$ only enables memory array 50$a$ or memory array 50$b$. Further, within each I/O block, 63 of the 64 bit lines would be connected through the AC code circuit 70 to $V_{cc}$.

Referring to FIG. 12(*b*) there is shown a plan view of the layout of a bit line and the associated transistors forming a portion of the AC Code circuit 70. As can be seen from FIG. 12(*b*), the layout of the AC Code circuit 70 is very compact, just like ROM code layout.

Similarly each of the Y Pass transistors 60 receives the column select signal Yx (which is also decoded from the address signals $A_0, A_1, A_2, A_3, A_4$ and $A_5$, and $A_{17}$) and connects a selected bit line to the data buffer 80. If the signal D, supplied to the data buffer 80 is high, (or input data="1") then the selected bit line is connected to $V_{cc}$—just like all the rest of the 63 bit lines in the same I/O block. When input data="1", the cell remains in the erased state. If the signal D, supplied to the data buffer 80 is low, (or input data="0") then the selected bit line is connected to $V_{ss}$. This programs the selected cell.

Each of the word lines is made from polysilicon one (poly1) layer. Each of the floating gate 24 of each of the cells is made from polysilicon two (poly2) layer. Each of the congx lines connecting to the control gate 30 of the cells is made from polysilicon three (poly3) layer. Each of the agndx lines connecting to the source 14 of the cells is made from the diffusion layer in the substrate. Finally, each of the bit lines connecting to the drain 16 of the cells is made from metal 1 (metal1) layer.

The congx lines (poly3) are supplied from the periphery of the array 40$a$ or 40$b$, i.e. from the control gate and AVSS driver 46$a$ or 46$b$, toward the word line decoder 42, and carry high voltage during programming and erase, and are parallel to the word lines (poly1). They do not cross the word lines, nor do they cross the word line decoder 42 located between the arrays 40$a$ and 40$b$. Furthermore, since the agndx lines (diffusion) are supplied from the periphery of the array 40$a$ or 40$b$, i.e. from the control gate and AVSS driver 46$a$ or 46$b$, toward the word decoder 42, and carry high voltage during programming and erase, and are parallel to the word lines (poly1), they do not cross the word lines, nor do they cross the word line decoder 42 located between the arrays 40$a$ and 40$b$. Furthermore, because the congx lines (poly3) and the agndx lines (diffusion) from the periphery are supplied only to the respective memory subarray, and do not cross the word line decoder 42, located between the memory subarrays 40$a$ and 40$b$, the design of the control gate/avss driver 46$a$ or 46$b$ permits the circuit to have twice the pitch of the memory cell in the Y direction (direction perpendicular to the poly1/poly3/diffusion lines). This permits easier layout design for the control gate array ground or AGNDx drivers 46$a$ or 46$b$. By separating the word line decoder 42 and the word lines from the congx lines, which carry the high voltage and the high voltage sources 100 from one another, with the memory array therebetween, deleterious effects of high voltage can be minimized.

To reduce the word line (poly1) and array $V_{ss}$ (or AGND) line (diffusion) resistance, a second metal layer (metal2) is employed. The metal2 layer is used solely to strap or connect various lines to one another. The metal2 layer is aligned parallel to the row lines (poly1), congx lines (poly3), and agndx lines (diffusion), and perpendicular to the bit lines (metal1). Thus, the metal2 layer is positioned over each of the poly1, poly3, and diffusion lines and crosses the metal 1 lines. In the operation of the control gate lines (congx lines, which are poly3), resistance is not critical. Therefore, the control gate lines (congx, or poly3) in each page are shorted at the ends of the memory array.

Figure 13:
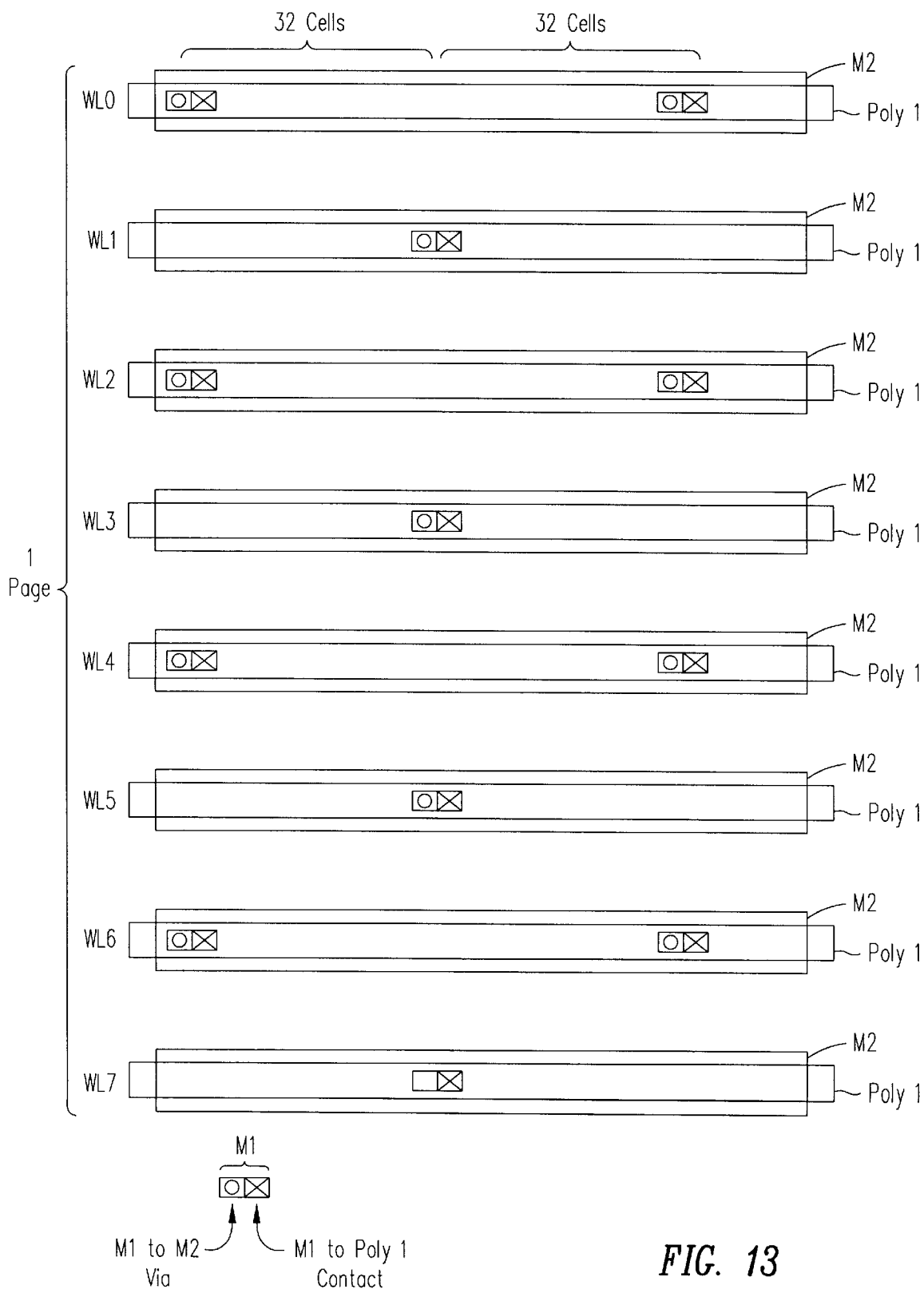
FIG. 13 is a top view of the strapping of polysilicon word lines to metal lines in the memory array.

The strapping of the various lines will be explained with respect to one page, since each of the arrays 40$a$ and 40$b$ is made from a plurality of pages. The strapping of the word lines (poly1) in a page is shown in FIG. 13, and is as follows. There are eight word lines in a page designated as WL0, WL1, WL2, WL3, WL4, WL5, WL6, and WL7. Each of four metal2 lines connects to each of the word lines WL0, WL2, WL4 and WL6 near cell 0, cell 64, cell 128, etc. Each of another four metal2 lines connects to each of the word lines WL1, WL3, WL5, and WL7 near cell 32, cell 96, cell 160 etc. Thus, odd and even word lines are strapped alternatingly spaced 32 cells apart. The strapping of metal2 to poly1 is accomplished by a via from metal2 to metal1 with a contact from metal1 to poly1 immediately adjacent thereto.

Figure 14:
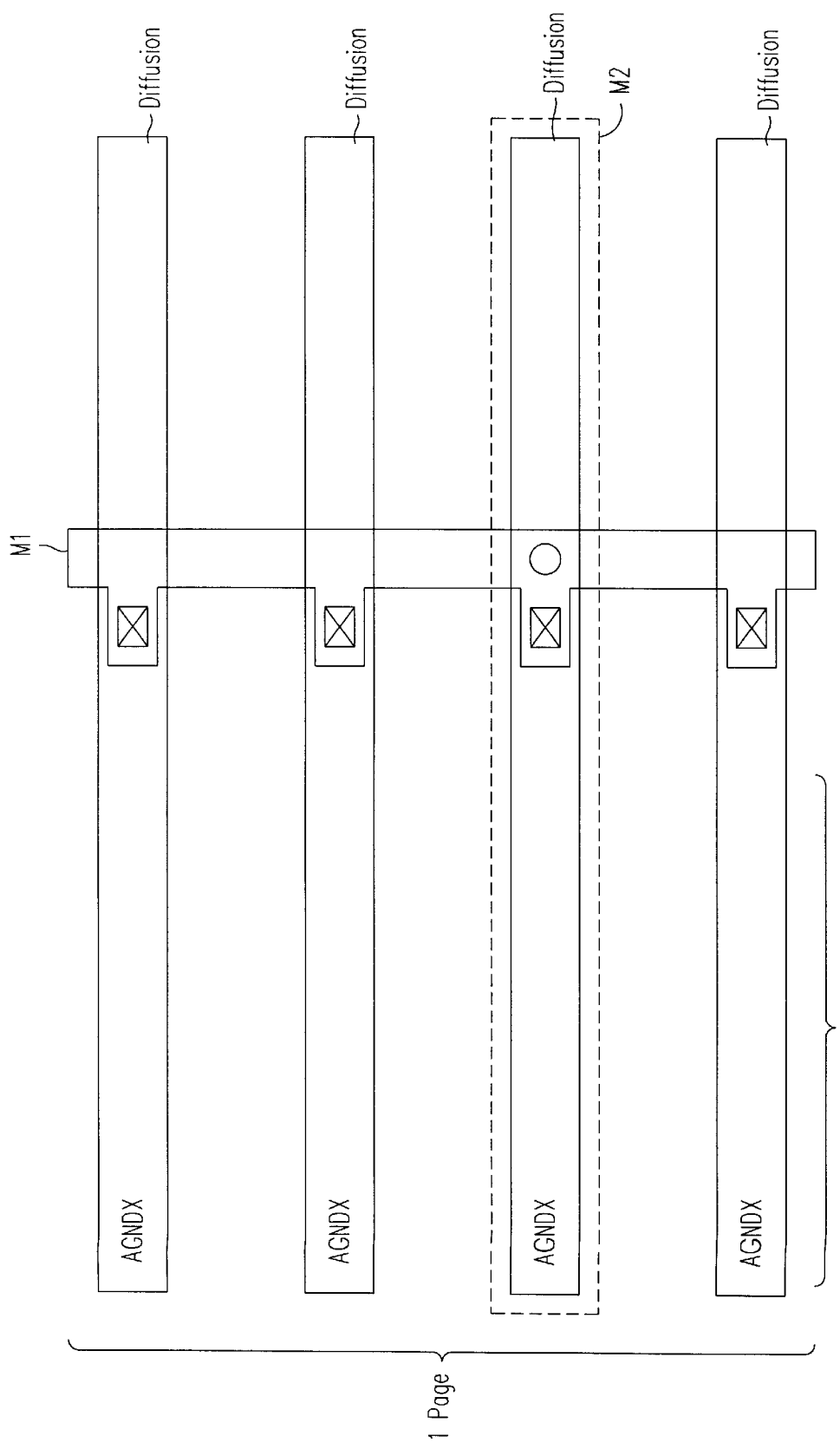
FIG. 14 is a top view of the strapping of the diffusion lines to metal lines in the memory array.

For the strapping of diffusion lines or AGND in each page, the strapping is shown in FIG. 14, and is as follows. In each page there are four diffusion lines or AGND lines, with each supplied to two rows of memory cells with adjacent rows of cells having the sources 14 connected to one diffusion line. A single metal2 section is aligned parallel to the four diffusion lines.

The strapping of the diffusion lines in each page to metal2 is as follows. A plurality of sections of metal1 are provided. The metal1 lines are placed perpendicular to the diffusion lines, and are spaced apart from one another by 32 cells. The metal1 lines are placed near cell 0, cell 32, cell 64, etc. In addition, the section of metal1 for each page is spaced apart from each section of metal1 for other pages. Each diffusion line has a contact hole to the section of metal1 in the page. Metal1 in turn is connected to metal2 by a via hole, adjacent to the contact hole between metal1 and diffusion.

Therefore, in summary, within each page there are 9 metal2 lines, all of which are parallel to the eight word lines. At every 32 cells (or strapping location), five of the nine metal2 lines are used. Four of the five metal2 lines are used to strap to four of the eight word lines, and the fifth metal2 line is used to strap to the diffusion line AGND. At a subsequent strapping location, i.e. 32 cells apart, another 4 metal2 lines are used to strap to four of the other eight word lines. The fifth metal2 line is used to strap to the diffusion line AGND.

As previously discussed, within each array 40a or 40b, there are 512 columns, divided into 8 I/O blocks, with each I/O block comprising 64 bit lines (shown in FIG. 9). Each of the 64 bit lines is activated by one of 6 address signals. When one of the bit lines is activated, all the other bit lines are not selected.

During page erase, all 8×512 cells of a page are erased simultaneously. This involves 6 volts being applied to the four agndx lines, where x is the selected page (0–255). The eight corresponding congx line (x=0–255) will have −10.0 volts applied thereto. All the bit lines of the selected array are at 3.5 volts, and the word lines of the selected array are grounded.

During reading, the voltage on the various lines of a selected page is as follows. The four AVSS lines or agndx lines are all grounded. The congx lines in the same selected page are biased at 1.5 v. A selected bit line will be connected to a source of 1.5 volts. All the non-selected bit lines in the same I/O block will be floating or have 0 volts applied thereto. The selected word line is biased at Vcc. All the other word lines are biased at 0 volts. The current flowing through the selected memory cell of a selected bit line (if the memory cell conducts) is detected by the associated sense amplifier 50, connected to the selected bit line through the Y-Pass transistor 60.

Finally during byte programming, a selected agndx line of the selected page (x=0–255) is connected to a source of 6 volts. All eight congx lines of the same selected page (x=0–255) are connected to a source of 10 volts. One of the eight lines (0–7) of word line of the same selected page (x=0–255) is connected to a source of +1.5 volts. At this point all 512 cells of the same selected row would have the following voltages applied: +1.5 volts on the word line, 10 volts on the control gate line, and 6 volts on the source 14 of the cells in the selected row. All the other memory cells of the non-selected rows in the selected page would have the following voltages applied: 0.0 volts on the word line, 10.0 volts on the control gate line, and 6 volts on the source 14 of the cells in the row. Finally, all the rows of the non-selected page would have the following voltages applied: 0.0 volts on the word line, 0.0 volts on the control gate line, and 0.0 volts on the source 14. The selected bit line voltage depends on the input data. When data="0", the voltage is 0.0 volt. When data="1", the voltage is about 3.5 volts. The voltage on the non-selected bit line is about 3.5 volts.

Testing

CHECKERBOARD TEST PATTERN

The memory array of the present invention along with the AC code circuit 70 is also particularly well suited for ease of testing. During byte programming operation, data from the external is supplied to the memory array and is programmed into the selected cells. In byte programming, 8 bits are selected with each consuming approximately 10 microamp for a total of approximately 80 microamps. In addition the byte programming time is approximately 10–20 microseconds.

Because the memory cell 10, 110, 210, 310, 410, 510, or 610 uses very low current for programming, it is possible to program a fixed test pattern all 512 bytes of a selected page, at once, for testing. This greatly speeds the testing process. In particular, if 100 microseconds were allocated for programming, during testing, then the current consumption for each cell to be programmed would be only on the order of 1 microamp. With 4K bits per page, this would require a total of approximately 4 milliamps, which is still within the capability of an on-board voltage pump. Thus, programming of 512 bytes with a fixed pattern during testing would require only 100 microseconds. In contrast if testing were performed using the byte programming technique, this would require a minimum of approximately 5120 microseconds. Thus, a savings of on the order of 50x in time would be achieved by on-board testing.

Figure 12A:
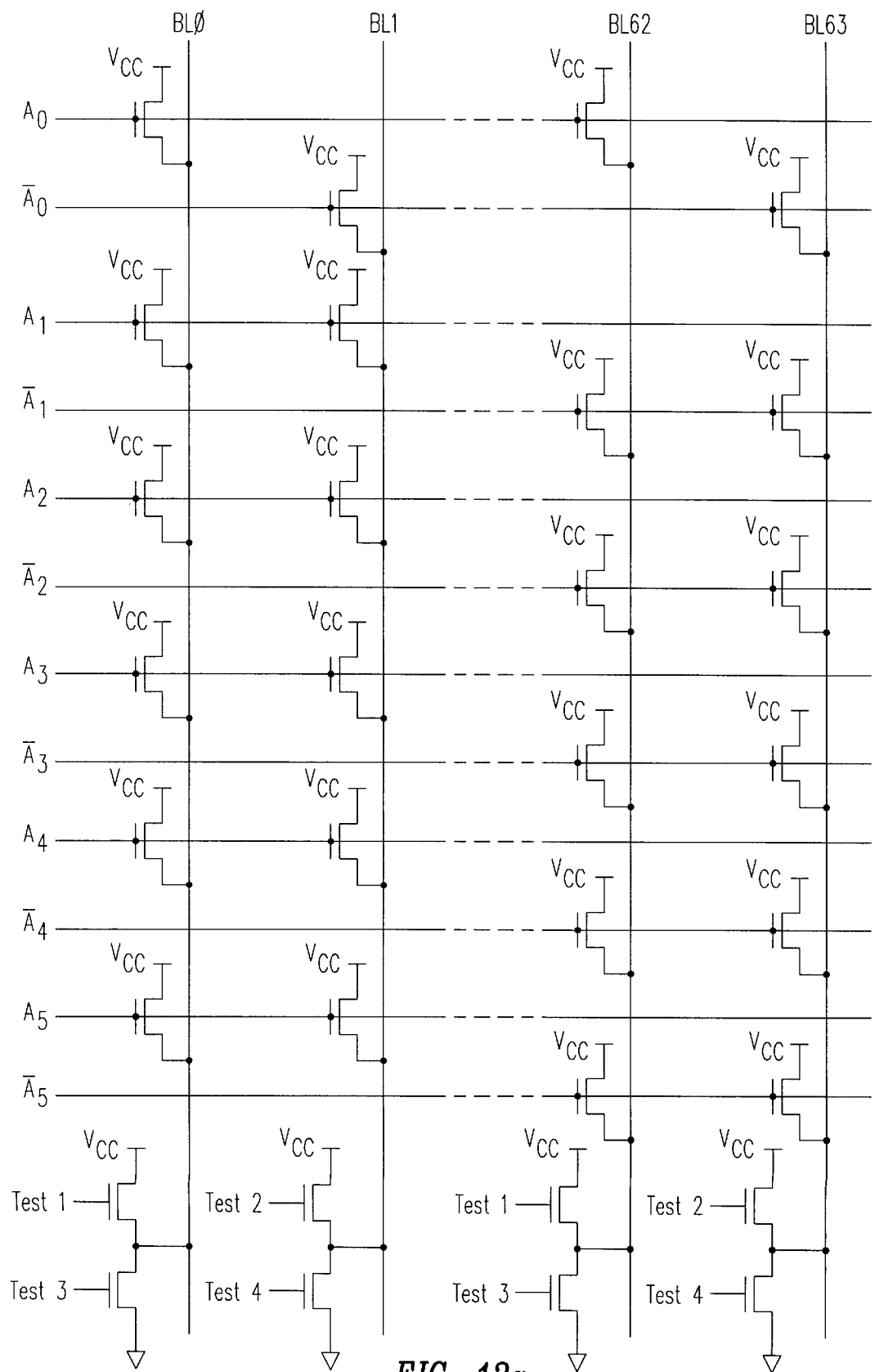
FIG. 12a is a detailed schematic diagram of the portion of the memory array shown in FIG. 10 for testing the memory cells of the memory array, and of the AC Code circuitry which is activated only during programming.

On board testing is achieved by the AC code circuit 70 shown in FIG. 12a. In particular, through the selection of the test signals, i.e. test1, test2, test3, or test4, selected voltages can be applied to the bit lines. Along with other appropriate voltages applied to the control gate line, word line, and AGND, the memory cells of the selected page can be programmed simultaneously. Test1 and test3 are applied to the odd bit lines, while test2 and test4 are applied to the even bit lines.

Address line $A_0$ is connected to a transistor at every even bit line, e.g. BL0, BL2, BL4 . . . BL62, while its complement is connected to a transistor at every odd bit line, e.g. BL1, BL3, BL5 . . . BL63. Address line $A_1$ is connected to a transistor at every two consecutive bit lines, starting with BL0, e.g. BL0, BL1, BL4, BL5 . . . BL61. Its complement is of course connected to a transistor at every two consecutive bit lines, starting with BL2, e.g. BL2, BL3, BL6, BL7 . . . BL62, BL63. Address line $A_2$ is connected to a transistor at every four consecutive bit lines, starting with BL0, e.g. BL0, BL1, BL2, BL3 . . . BL59. Its complement is of course connected to a transistor at every four consecutive bit lines, starting with BL4, e.g. BL4, BL5, BL6, BL7 . . . BL60, BL61, BL62, BL63. Address line $A_3$ is connected to a transistor at every eight consecutive bit lines, starting with BL0, e.g. BL0–BL7 . . . BL55. Its complement is of course connected to a transistor at every eight consecutive bit lines, starting with BL4, e.g. BL8–BL15 . . . BL56–BL63. Address line $A_4$ is connected to a transistor at every sixteen consecutive bit lines, starting with BL0, e.g. BL0–BL15 . . . BL47. Its complement is of course connected to a transistor at every sixteen consecutive bit lines, starting with BL16, e.g. BL16–BL31 . . . BL48–BL63. Finally, address line $A_5$ is connected to a transistor at every thirty-two consecutive bit lines, starting with BL0, e.g. BL0–BL31. Its complement is of course connected to a transistor at every thirty-two consecutive bit lines, starting with BL32, e.g. BL32–BL63.

Figure 12B:
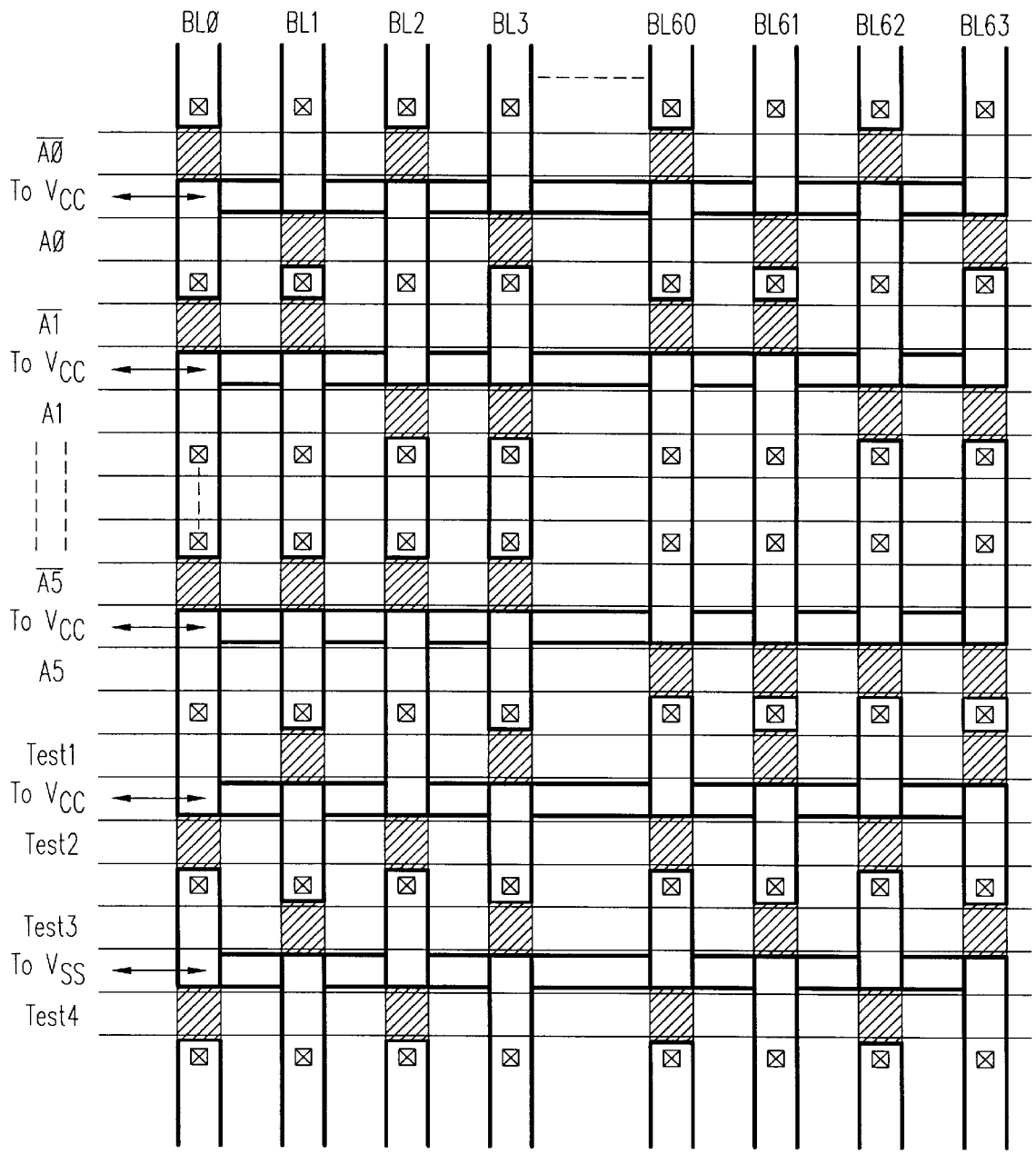
FIG. 12b is a plan view of the layout of the AC Code circuitry showing the compactness of the design.

FIG. 12b shows the layout of the AC Code 70 including the transistors for the test circuits, which are shown in FIG. 12a, the cut in the diffusion indicates an oxide region. Where the address line (or the test1, test2, test3, and test4 lines) in polysilicon, crosses the diffusion region, a transistor is formed.

For example (example 1), if a bit pattern of:

even word line: 0 0 0 0 0 0 0 0 etc.

odd word line: 1 1 1 1 1 1 1 1 etc.

from one of the I/O ports in a selected page is desired, then test1 and test2 are low, with test3 and test4 high. The even word lines are brought to 1.5 volts. The odd word lines are at ground. All the control gates in the selected page are at 10 volts. All the AGND lines in the selected page are at the programming voltage of 6 volts.

Another example (example 2) is the bit pattern of:

odd word line: 0 0 0 0 0 0 0 0 etc.

even word line: 1 1 1 1 1 1 1 1 etc.

This is just the reverse of example 1. The only difference is the voltage on the odd word lines and the even word lines are exchanged.

Another example (example 3), is the bit pattern of:

even word line: 1 0 1 0 1 0 1 0 etc.

odd word line: 1 1 1 1 1 1 1 1 etc.

In this case, test1 and test4 are high, and test2 and test3 are low. The even word lines are at 1.5 volts, and the odd word lines are at 0.0 volts.

Another example (example 4), is the bit pattern of:
odd word line: 1 0 1 0 1 0 1 0 etc.
even word line: 1 1 1 1 1 1 1 1 etc.
this is just the reverse of example 3, with the voltages on odd and even word lines exchanged.

Combining examples 3 and 4 yields the test bit pattern of
odd word line: 1 0 1 0 1 0 1 0 etc.
even word line: 0 1 0 1 0 1 0 1 etc.
Other test bit patterns include:
odd word line: 0 1 0 1 0 1 0 1 etc.
even word line: 1 1 1 1 1 1 1 1 etc. (example 5)
and
even word line: 0 1 0 1 0 1 0 1 etc.
odd word line: 1 1 1 1 1 1 1 1 etc. (example 6)
and
even word line: 0 0 0 0 0 0 0 0 etc.
odd word line: 0 0 0 0 0 0 0 0 etc. (example 7)

The voltages used for generating the test patterns in the selected page are as follows:

|  | Data | | | |
| --- | --- | --- | --- | --- |
|  | "0" | "1" | "1" | "1" |
| AGND | 6 v | 6 v | 6 v | 6 v |
| CONG | 10 v | 10 v | 10 v | 10 v |
| WL | 1.5 v | 1.5 v | 0 v | 0 v |
| BL | 0 v | 3.5 v | 0 v | 3.5 v |

Stress Test

The cells during testing can be further stressed to determine their reliability. The programming voltages as set forth above, can be increased to increase the stress on the memory cells. The voltage applied to CONG of the cells in the non-selected row of the selected page or of the cells in the selected row is increased by approximately 1.5 volts. In the circuit shown in FIG. 15, a voltage pump 90 generates an output signal VPG of approximately 13.0 volts. This high voltage is supplied through transistor 98 (whose gate is connected to the drain), causing a one diode drop of approximately 1.5 volts. Thus, approximately 11.5 volts is supplied to transistor 92. During normal operation, transistor 92 (whose gate is connected to the drain), also causes a one diode drop of approximately 1.5 volts. Therefore, during normal operation, approximately 10.0 volts is supplied as the output signal VCONG. During testing, however, HPGM signal is high. This causes the level shifter 94 to be activated, which turns on transistor 96. When transistor 96 is on (and its gate is at about 13 volts), it causes the voltage from the pump to by pass transistor 92, thereby supplying the 11.5 volts to the CONG lines. This causes an additional voltage stress to be placed on the erased cells during testing. Thus, test time can be reduced during testing to achieve the same stress effect.

Negative Voltage Circuit

FIG. 17 is a chart showing the voltages applied to the memory cells during various operations of program, page erase, and read. The cells identified as cells A, B, C, E and G refer to the cells shown in FIG. 9.

Figure 18:
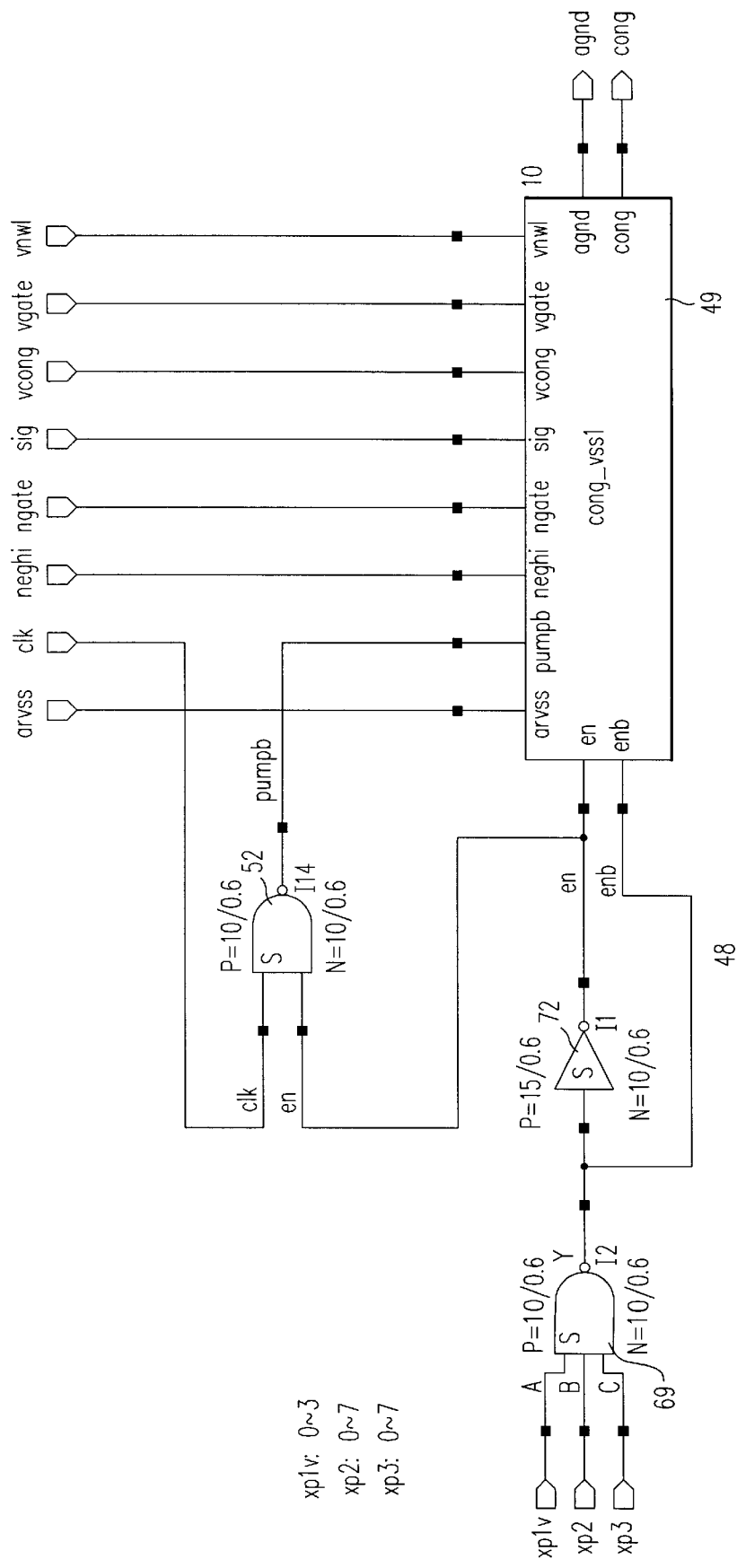
FIG. 18 is a block diagram of a local negative charge pump, in which a local charge pump is associated with each page or sector of memory cells.

Schematically, each of the control gate and AVSS driver 46 can be viewed as comprising 256 control units 48, each of which is shown in block diagram form in FIG. 18. Each of the control gate and AVSS driver 46a and 46b receives 20 page pre-decoder output lines generated from input page addresses, which are grouped in three groups: xp1v:0–3; xp2:4–11; and xp3:12–19. One of the output of the page pre-decoder lines from xp1, and one of the output of the page pre-decoder lines from xp2, and one of the output of the page pre-decoder lines from xp3 are supplied to a three input NAND gate 69 of each control unit 48. The output of the NAND gate 69 is inverted by an inverter 72. If the three chosen signals supplied to the NAND gate 69 are high, then the output of the invertor 72, signal en, will be high. This is supplied as an input to a second NAND gate 52 to which the clock signal clk is supplied as one of the other input signal. The output of the second NAND gate 52 is the signal pumpb, which is a decoded clk signal, i.e. the signal pumpb is the clock signal if the control unit 48 is the selected or decoded control unit 48. If the control unit 48 is not selected, the signal pumpb stays high and is not clocking. The signal pumpb is supplied to the circuit block 49.

Figure 19:
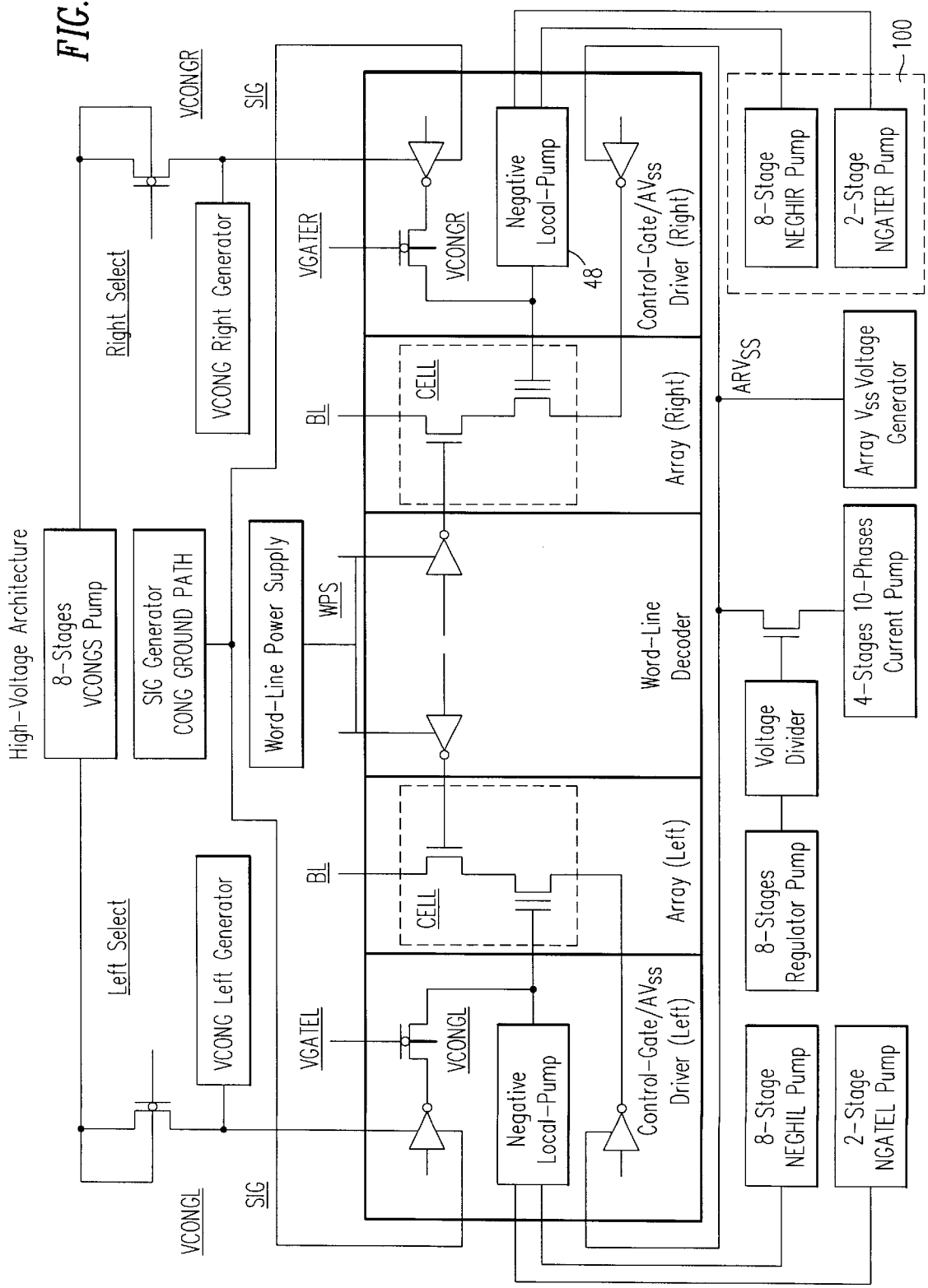
FIG. 19 is a block diagram showing the distribution of global charge pumps and local charge pumps used in the memory array.

The output of the circuit block 49 is the signals agnd and cong. The signal cong is the pumped negative voltage which is supplied to the control gate of the flash cell 10, 110, 210, 310, 410, 510 or 610 as described above, during erase. In the preferred embodiment the above described flash cells are arranged in an array with a common control gate line connecting the control gate of 512×8 cells in the same eight rows of the same page. As shown in FIG. 19, the common control gate lines extend only from the control gate driver (46a or 46b) into the memory array section (40a or 40b), and do not extend into the word line decoder 42.

The output signal agnd is also supplied simultaneously to the source of the memory cells, in the same page (or eight rows of memory cells). Thus, by supplying a voltage of (6–7 volts) to the source of the cells arranged in the same eight rows (or page), and by supplying a negative voltage (−10 volts) to the control gate of the same cells arranged in the same eight rows, the cells in the eight rows can be erased simultaneously, based upon a decoded address signal, and a clock signal.

Figure 20A:
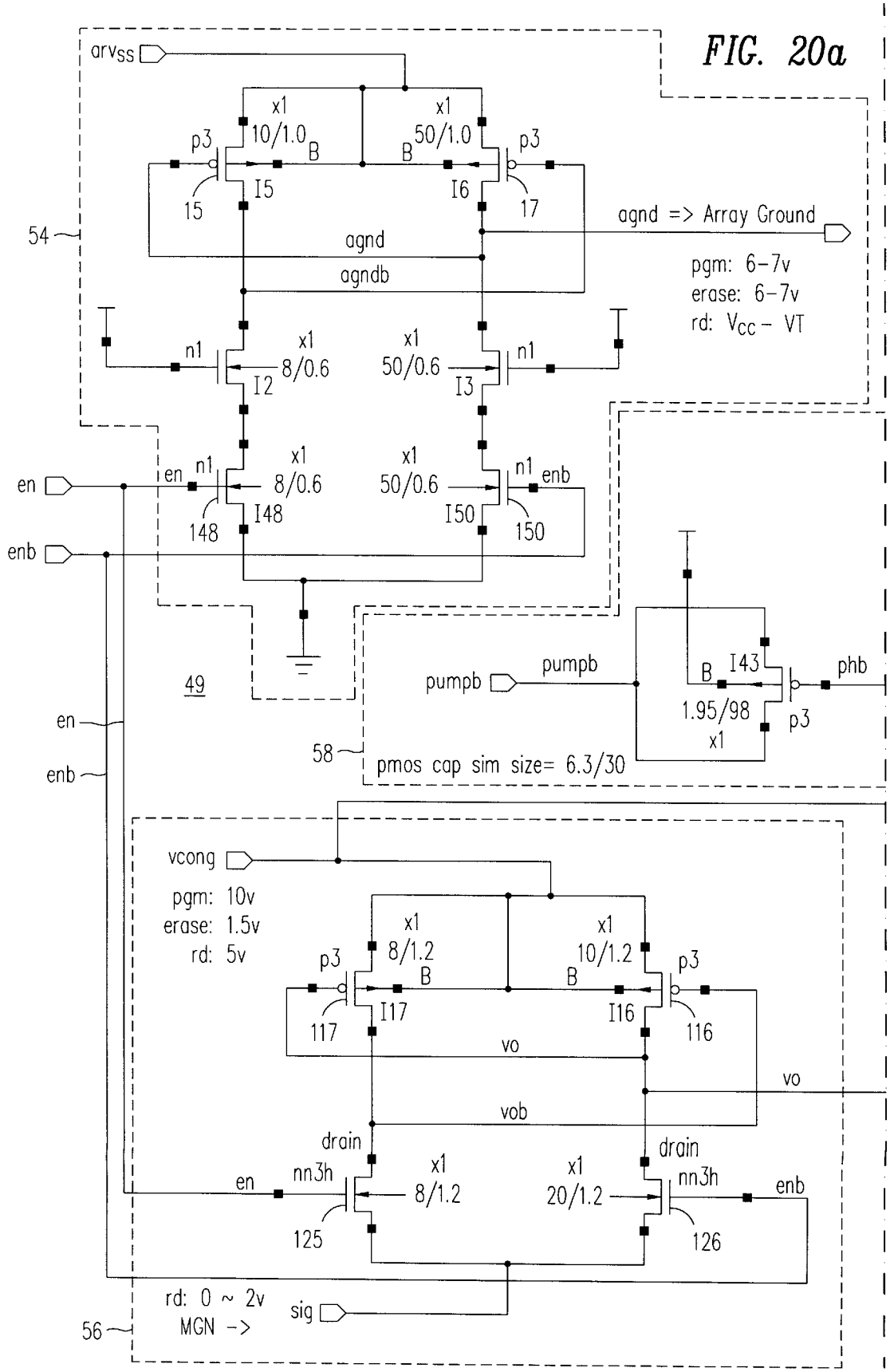
FIG. 20 is a detailed circuit diagram of a portion of the local charge pump shown in FIG. 18.
Figure 20B:
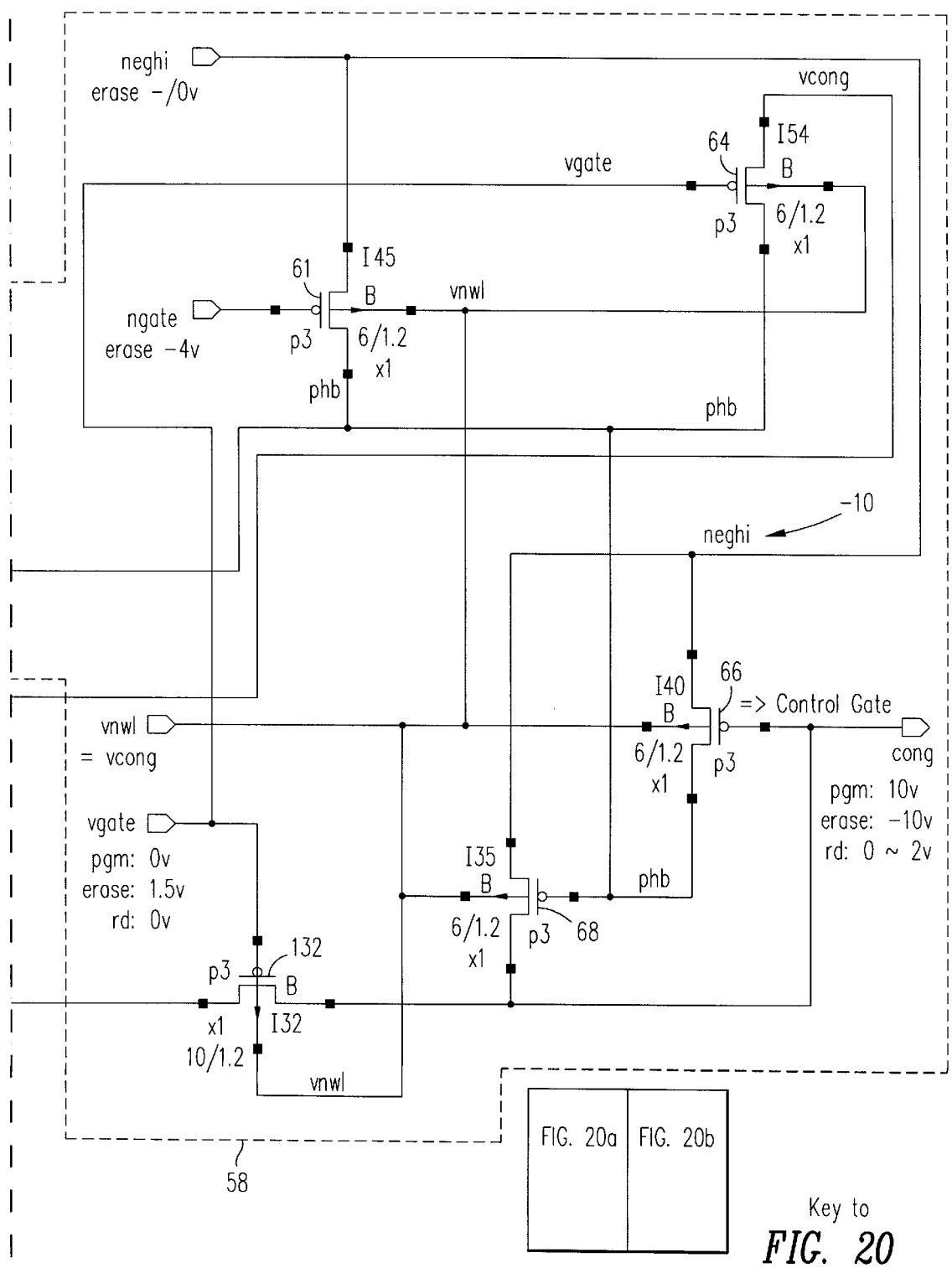

As shown in FIG. 20, the circuit block 49 comprises a first latch circuit 54 which receives the signal arvss, which is a power supply signal (6–7 volts) supplied during program and erase. In addition, the circuit block 49 also receives the enable signals en and enb or $\overline{en}$. In response, the circuit block 49 generates the agnd signal. The first circuit 54 receives the signal arvss and has two parallel current paths, to which the enable signals en and $\overline{en}$ (output of the invertor 72 and NAND gate 69) are supplied, respectively. When either the enable signal en or the $\overline{en}$ signal is high, the other would be low. This causes only one side of the first circuit 54 to be high. The two PMOS transistors labelled 15 and 17 are cross linked, so that if one of the PMOS transistor is on, the other will be off. If enable signal en is high, which means the selected page is for program or erase, this causes transistor 148 to conduct, bringing $\overline{agnd}$ to low, which turns on PMOS transistor 17. This causes the arvss signal to be supplied as the output agnd signal. If enable signal en is low, which means either read mode, or the page is not selected for program or erase, then transistor 150 would conduct. This is because enb or $\overline{en}$ is high. This brings agnd to ground.

The enable signals en and $\overline{en}$ are also supplied to a latch circuit 56. The latch circuit 56 is similar to the first circuit 54 in that it has two parallel current paths, cross coupling a pair of PMOS transistors. The signal Vcong is supplied to the source of the two PMOS transistors. Vcong is 10–12 volts during programming which is supplied to the control gate of the memory cells of the selected page, and is approximately 3.5 volts during the read mode and 1.5 volts during the erase mode. The drain of the PMOS transistor 116 provides the output signal vo. In this configuration, the latch circuit 56 prevents D.C. current flow. When en is high, transistor 125 is turned on connecting the signal sig to vob. During erase, sig is 0 volt. This turns on PMOS transistor 116, causing vcong (or 1.5 v) to be supplied to vo. During program, sig is 1.5 v. However, the voltage supplied to the source of PMOS transistor 116 is approximately 10 v. Thus, approximately 10 v will be supplied to vo during programming, when en is high. Finally, when en is low, enb is high. This turns on transistor 126 connecting vo to sig or approximately 1.5 v. During read mode, all control gates are at 1.5 volts.

Finally, the circuit block 49 comprises a second circuit 58 to supply a negative high voltage to the control gates of the memory cells of the selected page, during erase. During program and read modes, transistor 132 of circuit 58 is conducting to pass voltage of $V_0$ to cong, which is connected to the control gate of the memory cell. During erase mode, transistors 132 and 64 are off and control gate voltage is supplied by circuit block 58. The second circuit 58 receives the pump signal pumpb and the output signal vo from the latch circuit 56. The second circuit 58 also comprises a starter circuit 61, which receives a negative voltage signal neghi, which is on the order of −10 volts, during erase and +10 v during programming, and 3.5 volts during read.

The starter circuit 61 comprises a PMOS type transistor 61 having a gate, source, and a drain with the source connected to receive the input signal neghi, and the gate connected to receive the input signal ngate. The operation of the starter circuit 61 is as follows. When the input signal ngate is on the order of −4 volts during erase mode, the PMOS transistor 61 would conduct. However, because the voltage supplied to the source of the PMOS transistor 61 (namely the signal neghi) is more negative than the voltage on the gate of the PMOS transistor 61 (namely the signal ngate), the output of the PMOS transistor 61 at the drain thereof would be −4 volts +$|V_{th}|$ or approximately −2.75 volts. This is the signal phb. Phb is supplied to the gate of PMOS transistor 68, to which the signal neghi is supplied to the drain thereof. Since the gate voltage (on the order of −2.75 volts) to the PMOS transistor 68 is less negative than the drain voltage (on the order of −10 volts), the source voltage would be on the order −2.75+$|V_{thp}|$ or approximately −1.5 volts. This is the output signal cong.

Figure 22:
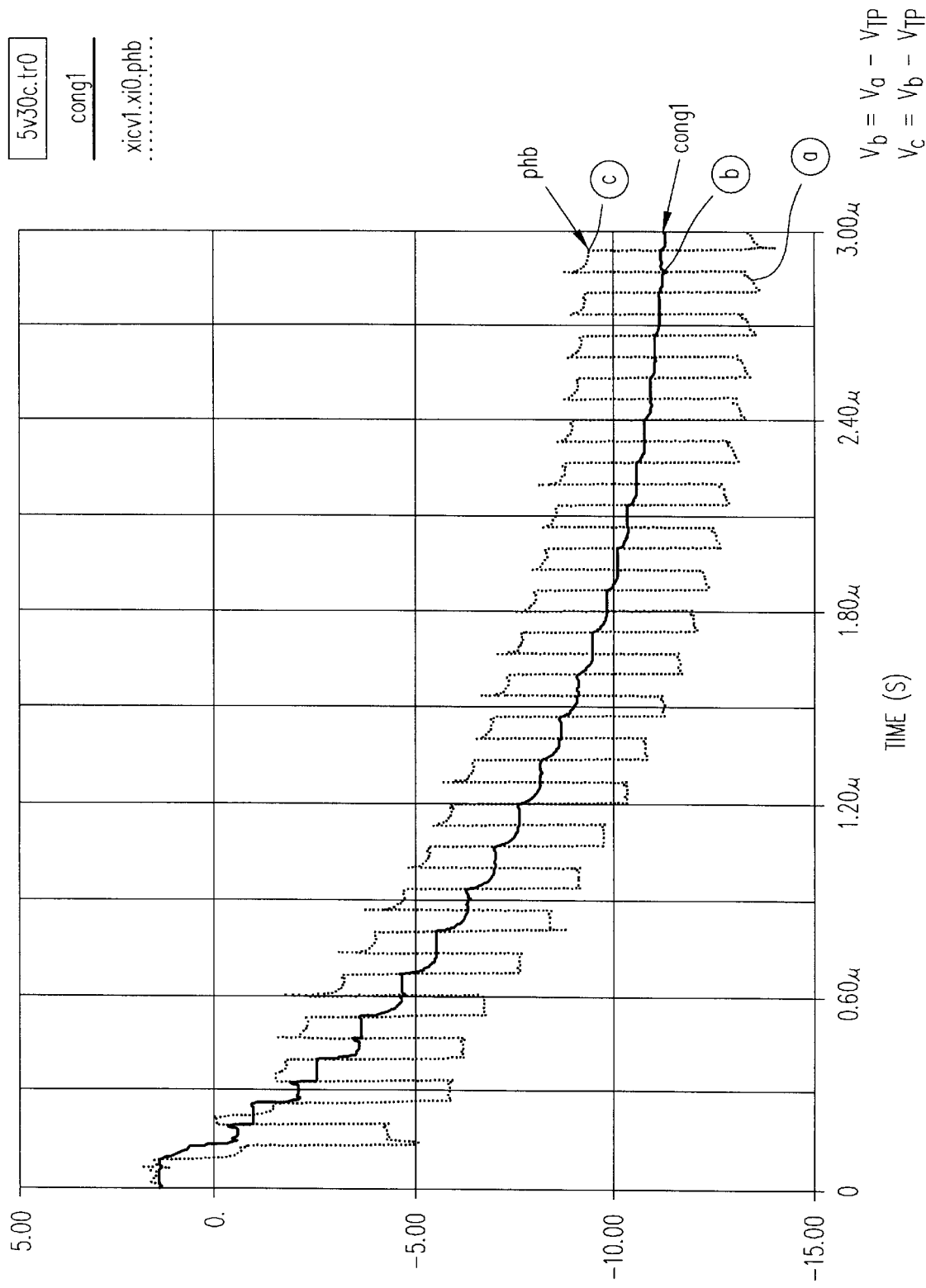
FIG. 22 is a graph of the voltages of further various signals used in the memory array as a function of time, showing the pumping action due to the charge pump.

For non-selected control gates, the pump signal pumpb is not clocking. The output voltage of cong is at −1.5 volts. For the selected control gates, the signal pumpb is clocking which causes the signal phb to become more negative. As the pump signal pumpb starts to pump, the signal phb begins to become more negative. This in turn causes the output signal cong to become more negative. Cong signal is also connected to transistor 66, which in turn will supply more negative voltage to node phb during the clock off cycle. This positive feedback continues to pump cong to neghi. Waveforms of the pumping action of the signal phb and cong are shown in FIG. 22. Cong1 is pumped to −10 v.

Figure 21:
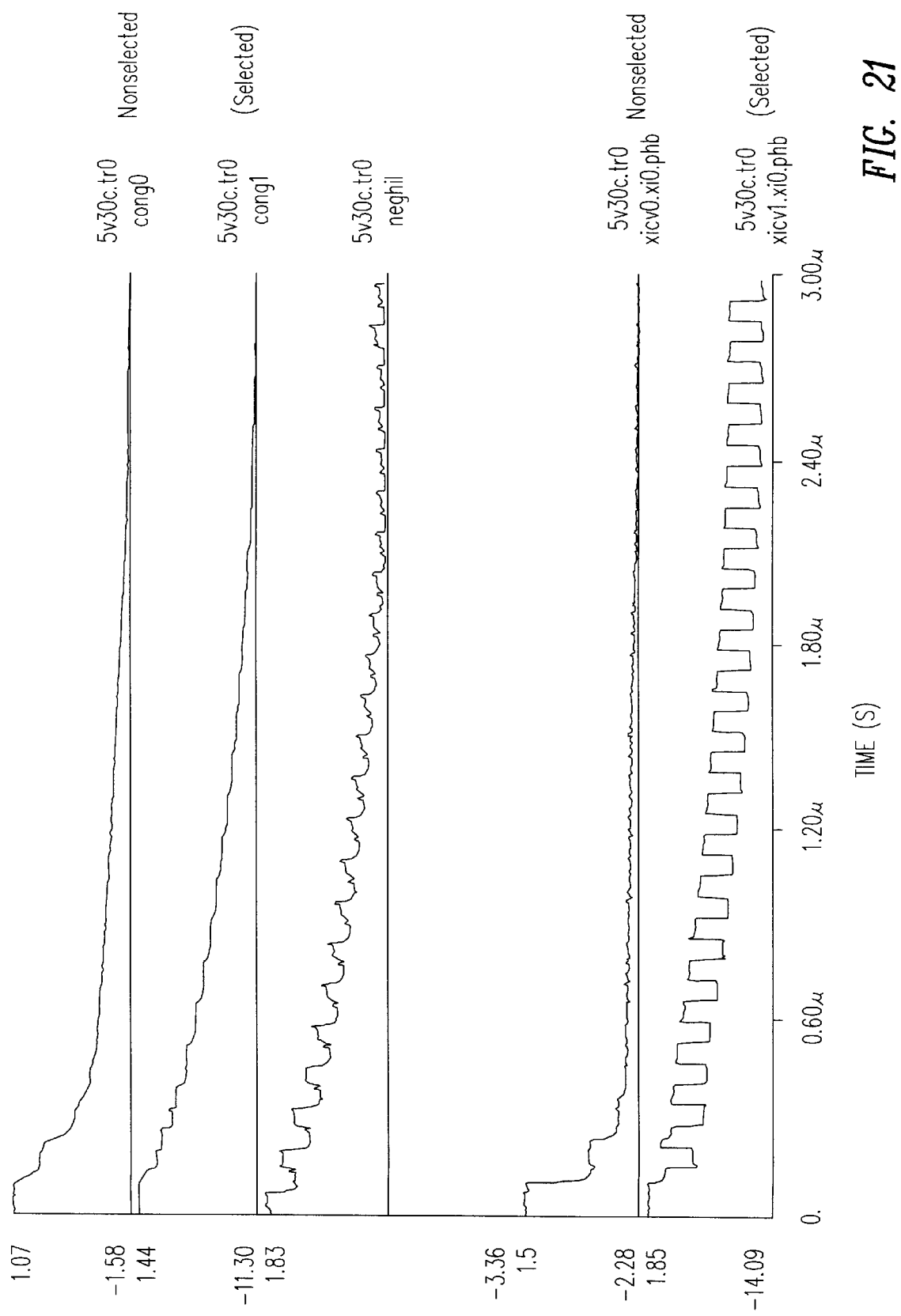
FIG. 21 is a graph of the voltages of various signals used in the memory array as a function of time, showing the pumping action due to the charge pump.

FIG. 21 shows the wave form of the signals (selected) and (unselected). For the non-selected control gates, phb is not clocking. Thus the voltage of cong for the non-selected memory cells is approximately at −1.5 volts or (−2.75+ $|V_{thp}|$).

The voltage for the various signals described in the three modes of operation: erase, program and read, are as follows:

|  | Erase | Program | Read |
|---|---|---|---|
| arvss | 6 v | 6 v | 3.5 v |
| vcong | 1.5 v | 10 v | 3.5 v |
| neghi | −10 v | 10 v | 3.5 v |
| ngate | −4 v | 10 v | 3.5 v |
| vgate | 1.5 v | 0 v | 0 v |
| sig | 0 v | 1.5 v | 1.5 v |
| agnd | 6 v-s | 6 v-s | 0 |
|  | 0 v-n | 0 v-n | 0 |
| cong | −10 v-s | 10 v-s | 1.5 v |
|  | −1.5 v-n | 1.5 v-n |  | where selected memory cells, and n is for the non-selected memory cells.

What is claimed is:

1. An electrically erasable and programmable read only memory array, said array comprising:

an array of memory cells, each memory cell comprising a single floating gate memory transistor having a plurality of terminals, said array of memory cells arranged in a plurality of rows and a plurality of columns;

a plurality of word lines connected to said plurality of rows of memory cells of said array with a word line connected to the memory cells in the same row;

a row decoder positioned adjacent one side of said array and connected to said plurality of word lines for receiving an address signal and for supplying a low voltage signal to said plurality of word lines in response thereto;

a plurality of first programming lines connected to said plurality of rows of memory cells of said array;

a plurality of second programming lines connected to said plurality of rows of memory cells of said array, with a first programming line and a second programming line connected to the memory cells in the same row;

said plurality of first and second programming lines are parallel to but spaced apart from said plurality of word lines and extending only to said row decoder; and a high voltage generating circuit, having address decoding circuitry therein, positioned adjacent another side of said array, opposite said one side, and connected to said plurality of first and second programming lines for receiving said address signal and for supplying a high voltage signal to said plurality of first and second programming lines in response thereto, with a first programming line connected to a row of memory cells and a second programming line connected to the same row of memory cells sharing the same address decoding circuitry.

2. The array of claim 1 wherein said array of memory cells is a first subarray of memory cells, wherein said plurality of word lines is a first plurality of word lines, and wherein said high voltage generating circuit is a first high voltage generating circuit.

3. The array of claim 2 further comprising:

a second subarray of memory cells, each memory cell comprising a floating gate memory transistor having a plurality of terminals, said second subarray of memory cells arranged in a plurality of rows and a plurality of columns;

said second subarray of memory cells having a one-side position adjacent said row decoder;

a plurality of second word lines connected to said plurality of rows of memory cells of said second subarray with a second word line connected to the memory cells in the same row;

each of said second word lines is substantially parallel and collinear with one of said first word lines of said first subarray memory;

a plurality of third programming lines connected to said plurality of rows of memory cells of said second subarray;

said plurality of third programming lines are collinear with but spaced apart from said plurality of first programming lines and extending only to said row decoder;

a plurality of fourth programming lines connected to said plurality of rows of memory cells of said second subarray with a third programming line and a fourth programming line connected to the memory cells in the same row;

said plurality of third and fourth programming lines are parallel to but spaced apart from said plurality of second word lines and extending only to said row decoder;

said plurality of fourth programming lines are collinear with but spaced apart from said plurality of second programming lines and extending only to said row decoder; and a second high voltage generating circuit, having address decoding circuitry therein, positioned adjacent another side of said second subarray, opposite said one side, and connected to said plurality of third and fourth programming lines for receiving said address signal and for supplying a high voltage signal to said plurality of third and fourth programming lines in response thereto, with a third programming line connected to a row of memory cells and a fourth programming line connected to the same row of memory cells sharing the same address decoding circuitry.

4. The array of claim 3 wherein each memory cell comprises:

a semiconductor substrate having a first region and a second region, with a channel therebetween, with said second region having a greater dopant concentration than said first region;

a select gate over said substrate and insulated therefrom and extending over a first portion of said channel;

a floating gate having a first portion over said select gate and insulated therefrom, and having a second portion insulated from said substrate and extending over a second portion of said channel and over a portion of said second region and lies between said select gate and said second region;

a control gate over said floating gate and insulated therefrom.

5. The array of claim 4 wherein each of said first and second word lines is connected to a select gate of said memory cell.

6. The array of claim 5 wherein each of said first and second programming lines is connected to a control gate and a second region of said memory cell respectively.

7. The array of claim 5 wherein each of said third and fourth programming lines is connected to a control gate and a second region of said memory cell respectively.

8. The array of claim 2 wherein each memory cell comprises:

a semiconductor substrate having a first region and a second region, with a channel therebetween, with said second region having a greater dopant concentration than said first region;

a select gate over said substrate and insulated therefrom and extending over a first portion of said channel;

a floating gate having a first portion over said select gate and insulated therefrom, and having a second portion insulated from said substrate and extending over a second portion of said channel and over a portion of said second region and lies between said select gate and said second region;

a control gate over said floating gate and insulated therefrom.

9. The array of claim 8 wherein each of said first word lines is connected to a select gate of said memory cell.

10. The array of claim 9 wherein each of said first and second programming lines is connected to a control gate and a second region of said memory cell respectively.

* * * * *